United States Patent
Huang et al.

(10) Patent No.: US 12,101,877 B2
(45) Date of Patent: Sep. 24, 2024

(54) CIRCUIT BOARD ASSEMBLY AND SEMI-FINISHED PRODUCT THEREOF, FLOODLIGHT, CAMERA MODULE AND APPLICATION THEREOF

(71) Applicant: NINGBO SUNNY OPOTECH CO., LTD., Yuyao (CN)

(72) Inventors: Zhen Huang, Yuyao (CN); Junjie Zeng, Yuyao (CN); Chenxiang Xu, Yuyao (CN); Feifan Chen, Yuyao (CN)

(73) Assignee: NINGBO SUNNY OPOTECH CO., LTD., Yuyao (CN)

( * ) Notice: Subject to any disclaimer, the term of this patent is extended or adjusted under 35 U.S.C. 154(b) by 707 days.

(21) Appl. No.: 17/182,353

(22) Filed: Feb. 23, 2021

(65) Prior Publication Data

US 2021/0185804 A1     Jun. 17, 2021

Related U.S. Application Data

(63) Continuation of application No. PCT/CN2019/097757, filed on Jul. 25, 2019.

(30) Foreign Application Priority Data

Aug. 24, 2018 (CN) .......................... 201810972689.2
Aug. 24, 2018 (CN) .......................... 201821378621.3

(51) Int. Cl.
*G01S 17/894* (2020.01)
*G03B 30/00* (2021.01)
(Continued)

(52) U.S. Cl.
CPC .......... *H05K 1/0296* (2013.01); *G01S 17/894* (2020.01); *G03B 30/00* (2021.01);
(Continued)

(58) Field of Classification Search
CPC ..... G01S 17/894; G01S 7/4813; G03B 30/00; H04N 23/56; H04N 23/57; H05K 1/0204;
(Continued)

(56) References Cited

U.S. PATENT DOCUMENTS 10,034,375 B2 * 7/2018 Pyper ..................... H05K 1/141
2012/0287646 A1 * 11/2012 Mandelboum ........ H01L 33/483
362/382

(Continued)

FOREIGN PATENT DOCUMENTS

CN      101449426 A    6/2009
CN      102214771 A    10/2011
(Continued)

OTHER PUBLICATIONS

International Search Report issued in corresponding International Application No. PCT/CN2019/097757; mailed Oct. 25, 2019; State Intellectual Property Office of the P.R. China, Beijing, China, 6 pgs.

(Continued)

*Primary Examiner* — Kathleen M Walsh
(74) *Attorney, Agent, or Firm* — HAUPTMAN HAM, LLP

(57) ABSTRACT

The present disclosure provides a circuit board assembly, a TOF camera module including the circuit board assembly and applications thereof. The circuit board assembly is used to support an electronic component, and includes a conductive portion and an insulating portion. The insulating portion is integrally bonded to the conductive portion, and the conductive portion extends through the insulating portion. The electronic component is supported by the conductive portion and is communicated with the conductive portion, so that the electronic component directly dissipates heat through the conductive portion during operation.

8 Claims, 13 Drawing Sheets

(51) Int. Cl.
*H04N 23/56* (2023.01)
*H04N 23/57* (2023.01)
*H05K 1/02* (2006.01)

(52) U.S. Cl.
CPC ............. *H04N 23/56* (2023.01); *H04N 23/57* (2023.01); *H05K 1/0274* (2013.01); *H05K 2201/10113* (2013.01); *H05K 2201/10121* (2013.01)

(58) Field of Classification Search
CPC ............... H05K 1/0274; H05K 1/0296; H05K 2201/09118; H05K 2201/10113; H05K 2201/10121; H05K 2201/10416; H05K 2201/2018; H05K 3/0014; H05K 3/0052; H05K 2201/10507; H05K 2201/10522; H05K 2203/173
USPC ........................................................ 348/135
See application file for complete search history.

(56) References Cited

U.S. PATENT DOCUMENTS

| | | | |
|---|---|---|---|
| 2015/0229912 A1* | 8/2015 | Masalkar | H04N 13/254 348/46 |
| 2016/0182891 A1* | 6/2016 | Ko | H04N 23/56 348/47 |
| 2016/0254638 A1* | 9/2016 | Chen | H04N 13/254 362/11 |
| 2017/0372602 A1* | 12/2017 | Gilliland | G01S 17/86 |
| 2019/0196215 A1* | 6/2019 | Lee | G02B 5/1876 |
| 2019/0235351 A1* | 8/2019 | Lee | H05K 1/181 |
| 2021/0099618 A1* | 4/2021 | O | H05K 1/18 |

FOREIGN PATENT DOCUMENTS

| | | | | |
|---|---|---|---|---|
| CN | 103779758 A | | 5/2014 | |
| CN | 104112811 A | * | 10/2014 | ............ H01L 33/62 |
| CN | 105572430 A | | 5/2016 | |
| CN | 108259724 A | | 7/2018 | |
| JP | 2011517125 A | | 5/2011 | |
| JP | 2011222870 A | | 11/2011 | |
| JP | 2013206895 A | | 10/2013 | |

OTHER PUBLICATIONS

Extended European Search Report issued in corresponding European Application No. 19851709.6; mailed Sep. 7, 2021, 8 pgs.

* cited by examiner

CIRCUIT BOARD ASSEMBLY AND SEMI-FINISHED PRODUCT THEREOF, FLOODLIGHT, CAMERA MODULE AND APPLICATION THEREOF

CROSS-REFERENCE TO RELATED APPLICATIONS

The present patent application is a continuation of International Application No. PCT/CN2019/097757, filed on Jul. 25, 2019, which claims priorities to Chinese Patent Application No. 201810972689.2, filed before the China National Intellectual Property Administration (CNIPA) on Aug. 24, 2018, and Chinese Patent Application No. 201821378621.3, filed before the CNIPA on Aug. 24, 2018. All of the aforementioned patent applications are hereby incorporated by reference in their entireties.

TECHNICAL FIELD

The present disclosure relates to the field of circuit boards, and more particularly, to a circuit board assembly and a semi-finished product thereof, a floodlight, a camera module, and applications thereof.

BACKGROUND

Circuit boards are important components in electronic equipment, which can support electronic components and communicate electrical signals. There are various types of circuit boards, and the most common is printed circuit boards. The printed circuit board mainly includes two parts, an insulating part and a conducting part. When an electronic component supported by a printed circuit board is activated after power on, the electronic component can generate heat due to its own power consumption, especially in the optical field. Once the heat generated by the electronic component cannot be dissipated, the temperature of the electronic component itself will rise, which is detrimental to the normal operation of the electronic component.

At present, the plates widely used in printed circuit board are copper-clad/epoxy glass cloth substrate or phenolic resin glass cloth substrate. These substrates have excellent electrical properties and processability, but have poor heat dissipation. However, with the miniaturization of electronic devices, electronic devices themselves are designed to be smaller and smaller, and therefore heat dissipation by only a small surface of the electronic devices is not enough.

Further, in the process of mounting the electronic components on the surface of the printed circuit board, it is generally necessary to fixedly connect electronic components through pads. This operation needs to be done at a high temperature. However, the thermal expansion coefficients of the insulating part and the conductive part of the printed circuit board are different, and the pads themselves are small in size, which may make alignment between the electronic components and the printed circuit board difficult, particularly for electronic components with high accuracy requirements, such as photovoltaic modules.

Ceramic substrates are a class of circuit boards with superior performance, and their electrical insulation performance, thermal conductivity, and mechanical strength are excellent. However, it is difficult to apply ceramic substrates to various electronic devices on a large scale. Because the basic manufacturing process of ceramic substrates is complex, the production capacity is low, and the cost is high.

The fever problem of electronic components is partially alleviated by the addition of heat dissipating blocks to the printed circuit board, but is contrary to the current trend of miniaturization and lightweight of electronic devices.

SUMMARY

It is an object of the present disclosure to provide a circuit board assembly and a semi-finished product thereof, a floodlight, a camera module and an application thereof, wherein the circuit board has good heat dissipation performance.

Another object of the present disclosure is to provide a circuit board assembly and a semi-finished product thereof, a floodlight, a camera module and an application thereof, wherein the circuit board is manufactured at a relatively low cost.

Another object of the present disclosure is to provide a circuit board assembly and a semi-finished product thereof, a floodlight, a camera module and an application thereof, wherein the circuit board is manufactured in a simple manner and is convenient for large-scale application.

Another object of the present disclosure is to provide a circuit board assembly and a semi-finished product thereof, a floodlight, a camera module, and applications thereof, wherein the circuit board includes an insulating portion and at least one conductive portion, and wherein the conductive portion provides a large area for heat dissipation of an electro component.

Another object of the present disclosure is to provide a circuit board assembly and a semi-finished product thereof, a floodlight, a camera module, and an application thereof, wherein the conductive portion has a large upper surface to facilitate accurate mounting of the electronic component on the conductive portion.

Another object of the present disclosure is to provide a circuit board assembly and a semi-finished product thereof, a floodlight, a camera module and an application thereof, wherein the circuit board has a good conductive property.

Another object of the present disclosure is to provide a circuit board assembly and a semi-finished product thereof, a floodlight, a camera module, and an application thereof, wherein the insulating portion of the circuit board is integrally molded to the conductive portion.

Another object of the present disclosure is to provide a circuit board assembly and a semi-finished product thereof, a floodlight, a camera module and an application thereof, wherein the circuit board has high mechanical strength.

Another object of the present disclosure is to provide a circuit board assembly and a semi-finished product thereof, a floodlight, a camera module, and an application thereof, wherein the circuit board can have better heat dissipation performance while maintaining a smaller size.

Another object of the present disclosure is to provide a circuit board assembly and a semi-finished product thereof, a floodlight, an camera module, and an application thereof, wherein by the manufacturing method, the circuit board can be manufactured in batches, thereby reducing the production cost.

Another object of the present disclosure is to provide a circuit board assembly and a semi-finished product thereof, a floodlight, a camera module, and an application thereof, wherein at least part of the insulating portion can be integrally molded around the conductive portion to prevent a short circuit from occurring.

Another object of the present disclosure is to provide a circuit board assembly and a semi-finished product thereof, a floodlight, a camera module, and an application thereof, wherein a TOF camera module with the circuit board can have better heat dissipation performance while maintaining a smaller size.

Another object of the present disclosure is to provide a circuit board assembly and a semi-finished product thereof, a floodlight, a camera module, and an application thereof, wherein the TCF camera module with the circuit board includes a base, and the base can be integrally molded to the circuit board.

According to one aspect of the present disclosure, there is provided a circuit board assembly for supporting an electronic component, including:

a conductive portion; and
  an insulating portion, integrally bonded to the conductive portion, wherein the conductive portion comprises a first conductive portion and a second conductive portion, and the electronic component is supported by the first conductive portion, wherein the first conductive portion extends through the insulating portion, and the first conductive portion and the second conductive portion are separated by at least part of the insulating portion, and wherein the first conductive portion has an upper surface, the second conductive portion has an upper surface, and the upper surface of the first conductive portion is larger than the upper surface of the second conductive portion.

According to some embodiments of the present disclosure, the first conductive portion has a side surface, and the side surface is arranged to be inclined.

According to some embodiments of the present disclosure, the side surface is arranged to be inclined inwardly.

According to some embodiments of the present disclosure, the side surface is arranged in a step shape.

According to some embodiments of the present disclosure, the first conductive portion has an upper surface and a lower surface, wherein the upper surface and the lower surface are oppositely disposed, wherein the upper surface is larger than the lower surface.

According to some embodiments of the present disclosure, the circuit board assembly further includes a connecting member, wherein the connecting member has two ends, one end of the connector is connected to the conductive portion, the other end of the connector is exposed, and wherein the insulating portion is integrally molded to the connecting member.

According to some embodiments of the present disclosure, the conductive portion has a side surface, and at least part of the insulating portion is integrally bonded to the side surface of the conductive portion.

According to some embodiments of the present disclosure, the side surface of the conductive portion is covered by the insulating portion completely.

According to some embodiments of the present disclosure, the circuit board assembly further includes a bracket, wherein the bracket forms a light window and the bracket is connected to the circuit board, and wherein the light window provides a light-passing path for the electronic component.

According to some embodiments of the present disclosure, the bracket is connected to the circuit board by a connecting medium.

According to some embodiments of the present disclosure, the bracket is integrally coupled to the conducive portion. Alternatively, the bracket is integrally coupled to the insulating portion. Alternatively, the bracket is integrally coupled to the conductive portion and the insulating portion.

According to some embodiments of the present disclosure, the conductive portion includes a third conductive portion and a fourth conductive portion, wherein the insulating portion is integrally molded to the third conductive portion and the fourth conductive portion, and wherein the first conductive portion, the second conductive portion, the third conductive portion, and the fourth conductive portion are separated by the insulating portion, respectively.

According to another aspect of the present disclosure, there is provided a semi-finished product of a circuit board assembly comprising:

a plurality of conductive portions and a plurality of insulating portions, wherein each of the conductive portions includes a first conductive portion and a second conductive portion, wherein the insulating portions are integrally molded to the first conductive portion and the second conductive portion, and for each conductive portion, the first conductive portion and the second conductive portion are separated by at least part of the insulating portion, and wherein adjacent conductive portions are connected to each other.

According to some embodiments of the present disclosure, the first conductive portion of one of the conductive portions is connected to the first conductive portion of an adjacent one of the conductive portions.

According to some embodiments of the present disclosure, the second conductive portion of one of the conductive portions is connected to the second conductive portion of an adjacent one of the conductive portions.

According to some embodiments of the present disclosure, the second conductive portion of one of the conductive portions is connected to the second conductive portion of an adjacent one of the conductive portions.

According to some embodiments of the present disclosure, the first conductive portion of one of the conductive portions is connected to the second conductive portion of an adjacent one of the conductive portions.

According to some embodiments of the present disclosure, the first conductive portion has an upper surface, and the second conductive portion has an upper surface, wherein the upper surface of the first conductive portion is larger than the upper surface of the second conductive portion.

According to some embodiments of the present disclosure, the first conductive portion has an upper surface and a lower surface that are oppositely disposed, wherein the upper surface of the first conductive portion is larger than the lower surface of the first conductive portion.

According to some embodiments of the present disclosure, the first conductive portion has a side surface, and the side surface is arranged to be inclined.

According to some embodiments of the present disclosure, the first conductive portion has a side surface, and the side surface is arranged in a step shape.

According to some embodiments of the present disclosure, the conductive portion includes a third conductive portion, wherein at least part of the insulating portion separates the first conductive portion and the third conductive portion, and at least part of the insulating portion separates the second conductive portion and the third conductive portion.

According to some embodiments of the present disclosure, the semi-finished product of the circuit board assembly further includes a plurality of brackets, and each of the brackets surrounds to form a light window. The brackets are integrally molded to the conductive portion. Alternatively, the brackets are integrally molded to the insulating portions.

According to another aspect of the present disclosure, there is provided a circuit board which is formed by dividing the semi-finished product of the circuit board assembly as described above.

According to another aspect of the present disclosure, there is provided a floodlight, comprising:
 a light-emitting element;
 a circuit board assembly, formed by dividing the semi-finished product of the circuit board assembly as described above; and
 a bracket, forming a light window, wherein the light-emitting element is supported by a first conductive portion of the circuit board assembly, and the bracket is connected to the circuit board assembly.

According to some embodiments of the present disclosure, the bracket is integrally molded to the circuit board assembly.

According to some embodiments of the present disclosure, the bracket is adhered to the circuit board assembly.

According to another aspect of the present disclosure, there is provided a TOF camera module, comprising:
 a floodlight as described above, wherein the floodlight is used to emit a light ray to a subject to be photographed; and
 a receiving unit, configured to receive a reflected light ray reflected by the subject to be photographed, and obtain a depth information of the subject to be photographed based on information of the emitted light ray and the reflected light ray.

According to another aspect of the present disclosure, there is provided a TOF camera module, comprising:
 a floodlight as described above; and
 a receiving unit having a flexible circuit board, and the receiving unit including a lens assembly, a photosensitive element, a circuit board, and a flexible circuit board, wherein the lens assembly provides an light-passing path for light to reach the photosensitive element for photoelectric conversion, and wherein the photosensitive element is conductively connected to the circuit board, the circuit board is conductively connected to the flexible circuit board, and the floodlight is conductively connected to the flexible circuit board.

According to another aspect of the present disclosure, there is provided a floodlight, comprising:
 a light-emitting element;
 a circuit board assembly, formed by dividing the semi-finished product of the circuit board assembly;
 a bracket, forming a light window, wherein the light-emitting element is supported by a first conductive portion of the circuit board assembly, and the bracket is connected to the circuit board assembly; and
 a flexible circuit board, conductively connected to the conductive portion of the circuit board assembly;
 wherein the semi-finished product of the circuit board assembly includes:
 a plurality of conductive portions and a plurality of insulating portions, wherein each of the conductive portions includes a first conductive portion and a second conductive portion, wherein the insulating portions are integrally molded to the first conductive portion and the second conductive portion, and the first conductive portion and the second conductive portion are separated by at least part of the insulating portion, and wherein adjacent conductive portions are connected to each other.

According to another aspect of the present disclosure, there is provided a TOE camera module, comprising:
 a floodlight as described above; and
 a receiving unit, including a lens assembly, a photosensitive element, and a circuit board, wherein the lens assembly provides a light-passing path for light to reach the photosensitive element for photoelectric conversion, and wherein the photosensitive element is conductively connected to the circuit board, and the flexible circuit board of the floodlight is conductively connected to the circuit board of the receiving unit.

According to another aspect of the present disclosure, there is provided an electronic device, comprising:
 a floodlight as described above;
 an electronic device body; and
 a main circuit board, disposed on the electronic device body, wherein the flexible circuit board of the floodlight is conductively connected to the main circuit board when the floodlight is mounted on the main circuit board.

According to some embodiments of the present disclosure, the electronic device includes a receiving unit, wherein the receiving unit and the floodlight are assembled as a whole to be installed together on the electronic device body.

According to another aspect of the present disclosure, there is provided a TOF camera module, comprising:
 a floodlight, used to emit a light ray to a subject to be photographed; and
 a receiving unit, configured to receive a reflected light ray reflected by the subject to be photographed, and obtain a depth information of the subject to be photographed based on information of the emitted light ray and the reflected light ray, wherein the floodlight includes a TOF light-emitting element and a circuit board assembly formed by dividing the semi-finished product of the circuit board assembly as described above, and wherein the TOF light-emitting element is supported by the conductive portion of the circuit board assembly.

According to another aspect of the present disclosure, there is provided an electronic device comprising:
 an electronic device body and a TOF camera module as described above, wherein the TOF camera module is disposed on the electronic device body.

According to some embodiments of the present disclosure, the electronic device includes a receiving unit, wherein the receiving unit and the floodlight are assembled as a whole to be installed together on the electronic device body.

According to another aspect of the present disclosure, there is provided a method of manufacturing a circuit board assembly for supporting at least one electronic component, comprising the steps of:
 (a) placing at least one conductive portion into a molding die;
 (b) performing a mold closing process by the molding die to form a molding space between the conductive portion and an upper mold and a lower mold and of the molding die;
 (c) adding a fluid material having an insulating property to the molding space so that the fluid material fills the molding space and solidifies within the molding space; and
 (d) after a mold drawing process is performed by the molding die, forming an insulating portion integrally bonded to the conductive portion on each of the conductive portions to obtain the circuit board assembly.

According to an embodiment of the present disclosure, in the above method, the conductive portion includes a first conductive portion and a second conductive portion, wherein the insulating portion is formed between the first conductive portion and the second conductive portion to separate the first conductive portion and the second conductive portion.

According to an embodiment of the present disclosure, in the above method, the insulating portion integrally bonded to the conductive portion and a bracket are formed on the conductive portion.

According to an embodiment of the present disclosure, the bracket is integrally bonded to the conductive portion. Alternatively, the bracket is integrally bonded to the insulating portion located on a side surface of the conductive portion. Alternatively, the bracket is integrally bonded to the conductive portion and the insulating portion.

According to an embodiment of the present disclosure, in the above method, the method further comprises the steps of:
- drawing the molding die to form a semi-finished product of the circuit board assembly, wherein the semi-finished product of the circuit board assembly includes a plurality of conductive portions and the insulating portions integrally bonded to the conductive portions; and
- dividing the semi-finished product of the circuit board assembly to obtain the circuit board assembly.

According to an embodiment of the present disclosure, in the above method, at least part of the insulating portion integrally bonded to a side surface of the conductive portion is formed on the conductive portion.

According to an embodiment of the present disclosure, in the above method, at least part of the insulating portion integrally bonded to an upper surface of the conductive portion is formed on the conductive portion. Alternatively, at least part of the insulating portion integrally bonded to a lower surface of the conductive portion is formed on the conductive portion.

According to an embodiment of the present disclosure, in the above method, when at least part of the insulating portion is integrally bonded to a lower surface of the conductive portion, the method further includes a step of reducing a thickness of the insulating portion to expose the lower surface of the conductive portion.

According to an embodiment of the present disclosure, in the above method, each of the conductive portions is independent of each other, According to an embodiment of the present disclosure, in the above method, a conductive portion is connected to an adjacent conductive portion.

According to another aspect of the present disclosure, there is provided a heat dissipation method of a circuit board assembly, comprising the steps of:
- directing heat generated by an electronic component to be transferred from a back surface of the electronic component to an upper surface of a first conductive portion;
- conducting heat to a lower surface of the first conductive portion; and
- dissipating the heat outward.

According to an embodiment of the present disclosure, in the above method, the electronic element is a light-emitting element.

According to an embodiment of the present disclosure, in the above method, a front surface of the electronic component is conductively connected to a second conductive portion.

DETAILED DESCRIPTION OF EMBODIMENTS

The following description is intended to disclose the invention to enable those skilled in the art to practice the invention. The preferred embodiments in the following description are by way of example only and other obvious variations will occur to those skilled in the art. The basic principles of the disclosure defined in the following description may be applied to other embodiments, modifications, improvements, equivalents, and other technical solutions without departing from the spirit and scope of the disclosure.

It will be understood by those skilled in the art that in the present disclosure, the orientation or positional relationship indicated by the terms "longitudinal," "transverse," "upper," "lower," "front," "rear," "left," "right," "vertical," "horizontal," "top," "bottom," "inner," "outer," and the like is based on the orientation or positional relationship shown in the accompanying drawings. These terms are merely intended to facilitate the description of the present disclosure and to simplify the description, rather than indicate or imply that the device or element referred to must have a specific orientation, be constructed and operated in a specific orientation, and therefore these terms should not be construed as limiting the present disclosure.

It will be understood that the terms "a" should be understood as "at least one" or "one or more", that is, in one embodiment, the number of an element may be one, and in another embodiment, the number of the element may be multiple. The term "a" cannot be understood as a restriction on quantity.

Figure 1A:
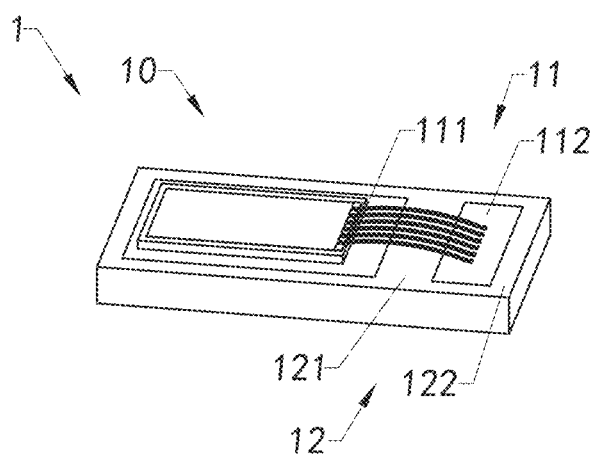
FIG. 1A is a schematic diagram of a circuit board assembly according to an embodiment of the present disclosure.
Figure 1B:
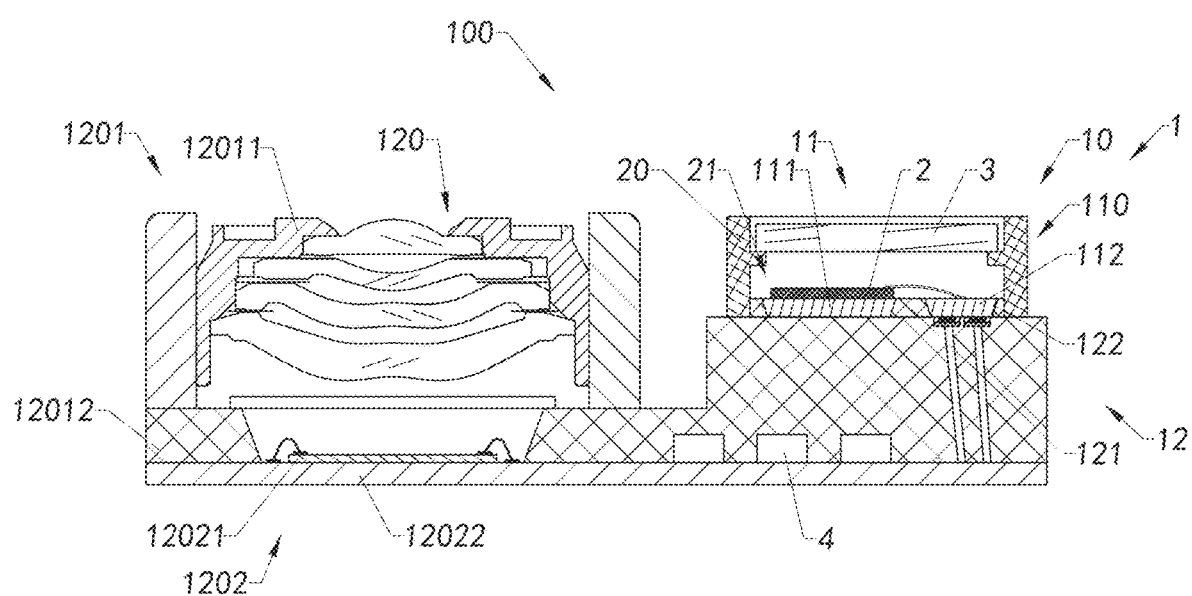
FIG. 1B is a schematic diagram of a TOF camera module with a circuit board assembly according to an embodiment of the present disclosure.
Figure 1C:
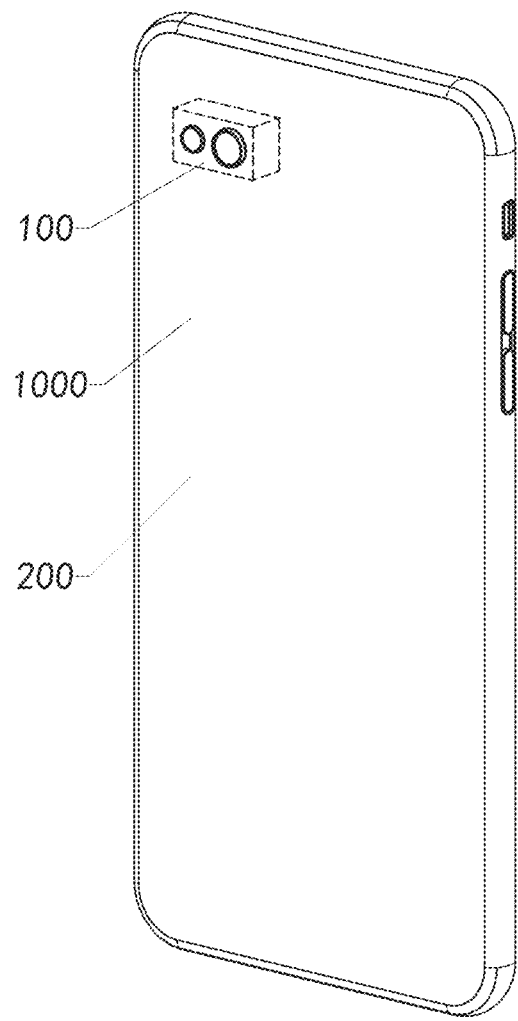
FIG. 1C is a schematic diagram of an electronic device according to an embodiment of the present disclosure.

Referring to FIGS. 1A to 1C, an embodiment of a circuit board assembly 1 and an application of the circuit board assembly 1 in accordance with the present disclosure is shown.

The circuit board assembly 1 is used for supporting an electronic component and helping the electronic component to dissipate heat in an operating state so as to keep the electronic component in a good operating state.

More specifically, the circuit board assembly 1 includes a circuit board 10 including a conductive portion 11 and an insulating portion 12. The insulating portion 12 is integrally coupled to the conductive portion 11, and the conductive portion 11 extends through the insulating portion 12, for example, in the height direction. That is, both ends of the conductive portion 11 are at least partially exposed to the outside, so that both ends of the conductive portion 11 can be respectively conducted. On the one hand, the conductive portion 11 can be conductive, and on the other hand, it can help the electronic component to dissipate heat.

The electronic component is supported on the conductive portion 11 and communicably connected to the conductive portion 11. More specifically, the conductive portion 11 includes a first conductive portion 111 and a second conductive portion 112. The first conductive portion 111 is used to support the electronic component, and the second conductive portion 112. and the first conductive portion 111 are spaced apart by the insulating portion 12, so that the first conductive portion 111 and the second conductive portion 112 are not in direct contact, thereby avoiding short-circuiting during use.

The first conductive portion 111 has an upper surface, a lower surface and a side surface, wherein the side surface extends at peripheral positions of the upper surface and the lower surface, and the upper surface and the lower surface are oppositely disposed. The electronic component is supported on the upper surface of the first conductive portion 111.

The second conductive portion 112 has an upper surface, a lower surface and a side surface, wherein the side surface extends at peripheral positions of the upper surface and the lower surface, and the upper surface and the lower surface are oppositely disposed.

The electronic component has an upper surface and a lower surface. The lower surface of the electronic component is connected to the upper surface of the first conductive portion 111. Further, pads on the upper surface of the electronic component are communicated. to the second conductive portion 112 by a gold wire process, and the lower surface of the electronic component is directly communicated to the upper surface of the first conductive portion 111. That is, the lower surface of the electronic component is implemented as an electrode, and the other electrode is provided on the upper surface of the electronic component and is conducted through the pads.

Further, the first conductive portion 111 is designed as a larger region to facilitate heat dissipation of the electronic component. Preferably, the first conductive portion 111 is designed as a larger region, and the second conductive portion 112 is designed as a smaller region. The first conductive portion 111 has a heat dissipation function in addition to conducting electricity. The second conductive portion 112 mainly functions to conducting electricity. In order to further ensure that the circuit board 10 is miniaturized while having a good heat dissipation performance, it is preferable that the overall size of the first conductive portion 111 is larger than that of the second conductive portion 112.

Note that the insulating portion 12 is bonded to the conductive portion 11 by an integrated molding process. In this way, the manufacturing process of the circuit board 10 is simplified, and the insulating portion 12 and the conductive portion 11 have a certain bonding strength. The conductive portion 11 is sized so that the circuit board 10 has good heat dissipation performance.

Further, the upper surface of the first conductive portion 111 is provided with a larger size to facilitate heat dissipation of the electronic component. The upper surface of the first conductive portion 111 is larger than the upper surface of the second conductive portion 112 to facilitate area saving. Preferably, while the upper surface of the first conductive portion 111 is designed to be of a larger size, the lower surface of the first conductive portion 111 is designed to be of a smaller size, so that the side surface of the first conductive portion 111 is provided to be inclined to facilitate the bonding strength of the first conductive portion 111 and the insulating portion 12 in the surrounding portion thereof. Further, when the lower surface of the first conductive portion 111 is designed to be a small size, it is possible to effectively prevent the lower surface of the first conductive portion 111 is too large to affect normal conduction, such as causing a short circuit, or the like, when the circuit board 10 needs to be conducted. Note that the upper surface of the first conductive portion 111 should be designed according to requirements, i.e., according to the size of the electronic component.

In other embodiments of the present disclosure, the upper surface of the first conductive portion 111 is provided smaller than the lower surface of the first conductive portion 111. In other embodiments of the present disclosure, the upper surface of the first conductive portion 111 is provided equal to the lower surface of the first conductive portion 111.

The conductive portion 11 may be a single metal or an alloy or even a conductive material of other materials having thermal conductivity, such as copper, nickel, aluminum or other materials having excellent thermal conductivity and electrical conductivity. It will be appreciated that the first conductive portion 111 and the second conductive portion 112 may be made of the same material or may be made of different materials.

The conductive portion 11 has a certain shape. In the present embodiment, the conductive portion 11 is provided in a rectangular-like structure, and the upper surface of the first conductive portion 111 and the upper surface of the second conductive portion 112 are both rectangular. The shape of the upper surface of the first conductive portion 111 and the shape of the upper surface of the second conductive portion 112 may be triangular, polygonal, or circular. The shape of the upper surface of the first conductive portion 111 may be similar to that of the upper surface of the second conductive portion 112, or may be different, for example, a circular shape or a rectangular shape. It will be appreciated that the above examples do not limit the first conductive portion 111 and the second conductive portion 112.

Further, in this example, the first conductive portion 111 has a boss structure in the stereoscopic space, and the second conductive portion 112 has a rectangular parallelepiped structure in the stereoscopic space. The first conductive portion 111 may be a rectangular parallelepiped, and the second conductive portion 112 may be a boss structure. Alternatively, both the first conductive portion 111 and the second conductive portion 112 have a boss structure. Alternatively, both the first conductive portion 111 and the second conductive portion 112 are rectangular parallelepiped. It will be appreciated that the above examples do not limit the first conductive portion 111 and the second conductive portion 112.

The conductive portion 11 may be first formed by a die stamping process or a chemical etching process, and then the insulating portion 12 is formed by an integral molding process at the conductive portion 11.

Further, the insulating portion 12 includes an insulating body 121 and an insulating frame 122. The insulating frame 122 is integrally formed on the insulating body 121, and the insulating frame 122 is located around the insulating body 121. The insulating body 121 is formed between the first conductive portion 111 and the second conductive portion 112 of the conductive portion 11. The insulating body 121 separates the first conductive portion 111 and the second conductive portion 112 so that the first conductive portion 111 and the second conductive portion 112 cannot be directly contacted, thereby preventing the first conductive portion 111 and the second conductive portion 112 from being directly contacted and causing a short circuit.

The conductive portion 11 has an upper surface, a lower surface and a side surface, wherein the upper surface and the lower surface are oppositely disposed, and the side surface extends at peripheral positions of the upper surface and the lower surface. The upper surface of the conductive portion 11 includes the upper surface of the first conductive portion 111 and the upper surface of the second conductive portion 112. The lower surface of the conductive portion if includes the lower surface of the first conductive portion 111 and the lower surface of the second conductive portion 112. The side surface of the conductive portion 11 includes a portion of the side surface of the first conductive portion 111 and a portion of the side surface of the second conductive portion 112.

The insulating frame 122 is formed on the side surface of the conductive portion 11. In this example, the insulating frame 122 is integrally bonded to the side surface of the conductive portion 11, so that on the one hand, the conductive portion 11 is protected, and on the other hand, the side surface of the conductive portion 11 can be prevented from being partially exposed, thereby causing an abnormality such as a short circuit.

Referring to FIG. 1B, embodiment of an application of the circuit board assembly 1, a TOF camera module 100, according to the present disclosure is shown.

TOF refers to Time of Flight, which performs measurement of the three-dimensional structure or three-dimensional contour of the measured object or the measured area by measuring the time interval t between transmission and reception of the emitted pulse signal or the phase (phase difference ranging method) generated by the laser to and fro the measured object at a time. A device manufactured by using a TOF principle can obtain a gray-scale image and a distance image, and is widely applied in various fields such as feeling control, behavior analysis, monitoring, automatic driving, artificial intelligence, and the like.

The TOF camera module 100 includes a floodlight 110 for generating a light ray to a subject to be photographed, the light ray being reflected by the subject, and a receiving unit 120 for receiving the reflected light ray and obtaining depth information of the subject to be photographed according to the information of the emitted light ray and the reflected light ray.

The receiving unit 120 includes a lens assembly 1201 for receiving light and a photosensitive circuit 1202 for receiving the light and converting the optical signal to an electrical signal based on a photoelectric conversion principle. The lens assembly 1201 further includes an optical lens 12011 and a base 12012, and the photosensitive circuit 1202 includes a photosensitive element 12021 and a circuit board 12022. The optical lens 12011 and the floodlight 110 are respectively supported on the base 12012, and the photosensitive element 12021 is conductively connected to the circuit board 12022. In this example, the base 12012 is integrally molded to the circuit board 12022. The floodlight 110 is conductively connected to the base 12012.

In the present embodiment, the electronic component is implemented as a light-emitting element 2, and the floodlight 110 includes the light-emitting element 2 and the circuit board assembly 1. The light-emitting element 2 is supported from the circuit board assembly 1 and communicably connected to the circuit board assembly 1. The light-emitting element 2 can be excited to emit light outwardly after being powered.

The light-emitting element 2 has a front surface and a back surface. The front surface of the light-emitting element 2 is communicated with the second conductive portion 112 of the conductive portion 11 through a wire, and the back surface of the light-emitting element 2 is directly supported by the conductive portion 11 and communicated with the conductive portion 11.

The circuit board assembly 1 includes the circuit board 10 and a bracket 20. The bracket 20 is disposed on the circuit board assembly 1, for example, the bracket 20 is integrally molded to the circuit board assembly 1. The circuit board assembly 1 includes the conductive portion 11 and the insulating portion 12. The conductive portion 11 includes the first conductive portion 111 and the second conductive portion 112. The first conductive portion 111 and the second conductive portion 112 are separated by the insulating portion 12 to avoid direct contact between the first conductive portion 111 and the second conductive portion 112. It will be appreciated that the bracket 20 may be attached to the circuit board 10 after the circuit board 10 has been molded. For example, the bracket 20 is attached to the circuit board 10 by a connecting medium such as glue.

The floodlight 110 further includes an optical auxiliary element 3. The bracket 20 supports the optical auxiliary element 3 on the circuit board 10 and the optical auxiliary element 3 is held in a light-passing path of the light-emitting element 2. The optical auxiliary element 3 is used to change or improve the light emitted by the light-emitting element 2, for example, to change the light emitted by the light-emitting element 2 in a refractive, diffractive and filter manner. The optical auxiliary element 3 may be a refractive lens or a diffractive lens. It will be appreciated by those skilled in the art that the above examples do not limit the type of the optical auxiliary element 3. The bracket 20 has a light window 21. The light-emitting element 2 cooperates with the bracket 20 to form the light window 21 so that light is emitted outwardly through the light window 21.

Further, in some examples of the present disclosure, the light-emitting element 2 may be implemented as a Vertical-Cavity Surface-Emitting Laser (VCSEL). After energization, the Vertical-Cavity Surface-Emitting Laser can be energized to emit laser light.

It should be noted that the Vertical-Cavity Surface-Emitting Laser needs to be maintained at a certain temperature range to be able to operate normally, that is, the heat dissipation performance of the circuit board assembly 1 is important to the operating state of the Vertical-Cavity Surface-Emitting Laser. Since the first conductive portion 111 of the circuit board assembly 1 provides a large heat dissipation area, the Vertical-Cavity Surface-Emitting Laser can operate normally when supported on the first conductive portion 111.

Further, a back surface of the Vertical-Cavity Surface-Emitting Laser is a negative electrode, and a front surface of the Vertical-Cavity Surface-Emitting Laser is a positive electrode. When the Vertical-Cavity Surface-Emitting Laser is respectively communicated with the first conductive portion 111 and the second conductive portion 112, the first conductive portion 111 is a negative electrode, and the second conductive portion 112 is a positive electrode.

The floodlight 110 further includes at least one electronic device 4. The electronic device 4 is conductively connected to the circuit board assembly 1. In this example, at least part of the electronic device 4 is disposed on the circuit board 12022 of the receiving unit 120 and is covered by the base 12012. The electronic device 4 is conductively connected to the circuit board assembly 1. Specifically, the electronic device 4 is conductively connected to the circuit board assembly 1 of the floodlight 110 through the circuit board 12022 of the receiving unit 120.

Referring to FIG. 1C, an embodiment of an electronic device 1000 according to the present disclosure is shown. The electronic device 1000 includes the TOF camera module 100 and an electronic device body 200. The TOF camera module 100 is disposed on the electronic device body 200 to obtain depth image information.

Figure 2A:
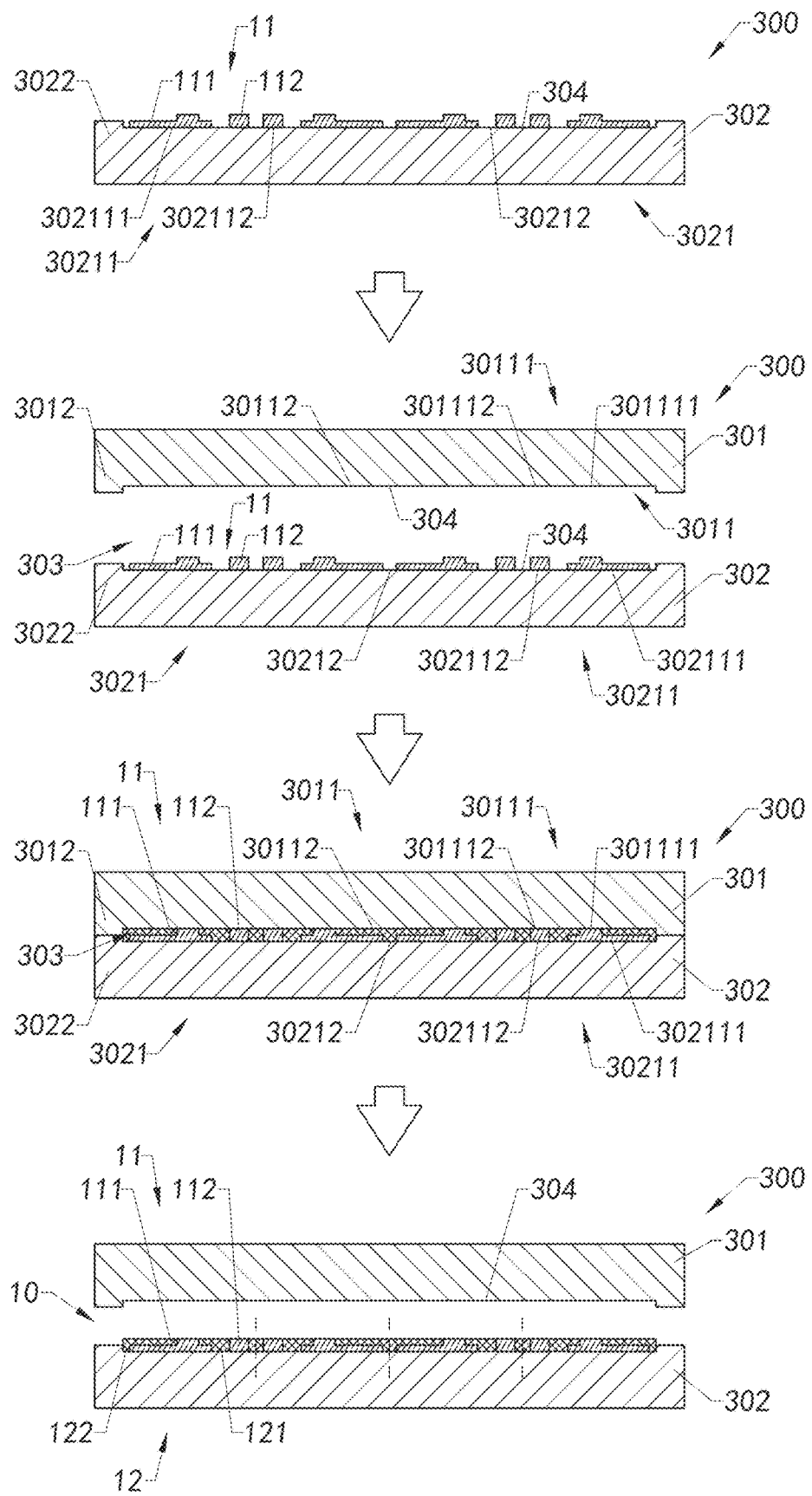
FIG. 2A is a schematic diagram of a manufacturing process of a circuit board assembly according to an embodiment of the present disclosure.
Figure 2B:
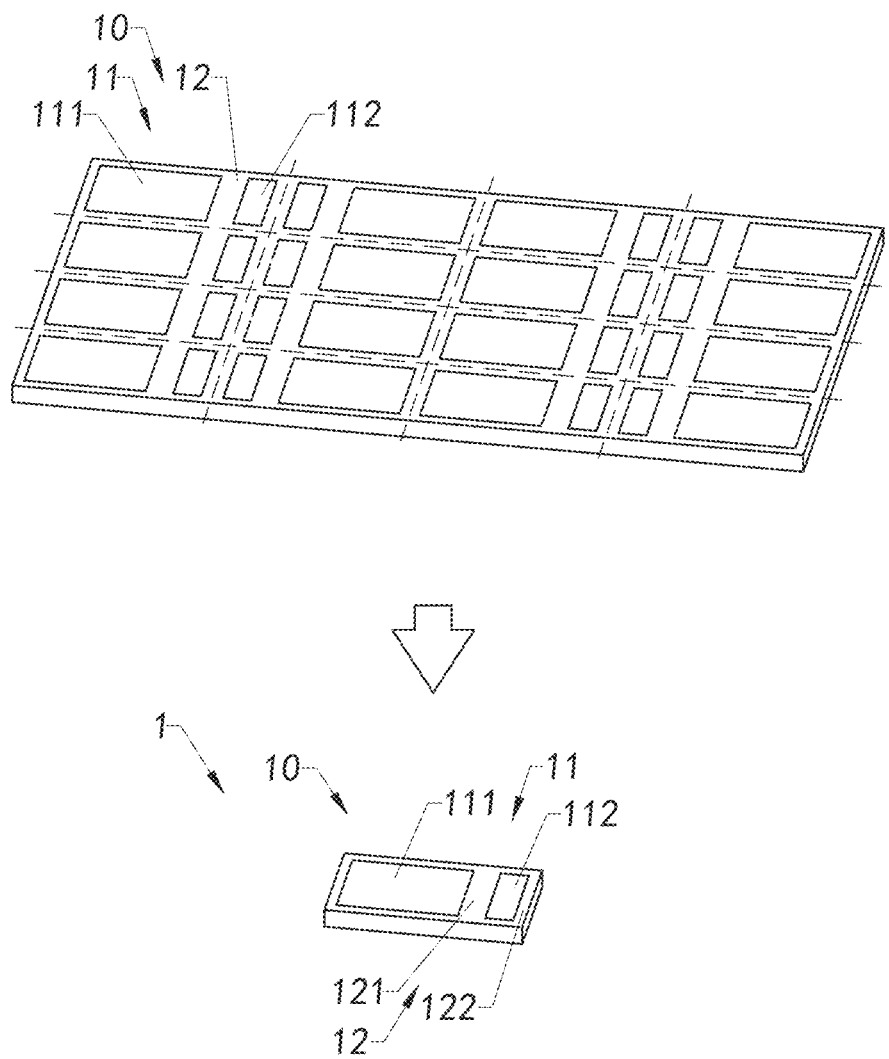
FIG. 2B is a schematic diagram of a manufacturing process of a circuit board assembly according to an embodiment of the present disclosure.

Referring to FIGS. 2A and 2B, an embodiment of a method of manufacturing a circuit board assembly 1 according to the present disclosure is illustrated. The circuit board assembly 1 is used to support an electronic component and to help the electronic component to dissipate heat in an operating state so as to maintain the electronic component in a good operating state.

At the stage shown in FIG. 2A, at least one conductive portion 11 is fixed in a molding die 300 to perform a molding process by the molding die 300.

Specifically, the molding die 300 includes an upper mold 301 and a lower mold 302. At least one of the upper mold 301 and the lower mold 302 can be operated to enable the molding die 300 to be subjected to mold closing and drawing operations. For example, in one embodiment of the present disclosure, a molding space 303 is formed between the upper mold 301 and the lower mold 302 after the conductive portion 11 is placed in the lower mold 302 and the upper mold 301 is subjected to a mold closing operation. That is, the lower mold 302 and the upper mold 301 communicate with each other after performing a mold closing operation. The upper mold 301, the lower mold 302 and the conductive portion 11 define the molding space 303. A fluid material can fill the molding space 303 to form the insulating portion 12 integrally bonded to the conductive portion 11.

With continued reference to FIG. 2A, the upper mold 301 further includes an upper molding portion 3011 and an upper pressing portion 3012. The upper pressing portion 3012 is provided at the periphery of the upper molding portion 3011 so that the upper pressing portion 3012 of the upper mold 301 can be pressed against an upper surface of the upper mold 301 after the molding die 300 is subjected to a mold closing process.

The upper molding portion 3011 has a lower surface. When the molding die 300 is subjected to a mold closing process, a part of the lower surface of the upper molding portion 3011 is pressed against the conductive portion 11, and the part of the lower surface of the upper molding portion 3011 and an upper surface of a corresponding part of the lower mold 302 form the molding space 303 for the passage of the fluid material.

In this example, since the upper and lower surfaces of the circuit board 10 of the circuit board assembly 1 are flat, the corresponding lower surface of the upper molding portion 3011 and the corresponding upper surface of the lower mold 302 are flat. The structure of the entire molding die 300 is simple, and the manufacturing difficulty and the manufacturing cost are low.

Further, the upper molding portion 3011 includes at least one conductive portion pressing portion 30111 and at least one insulating position molding portion 30112. The conductive portion pressing portion 30111 further includes a first conductive portion pressing portion 301111 and a second conductive portion pressing portion 301112. One of the insulating position molding portions 30112 is located between the first conductive portion pressing portion 301111 and an adjacent first conductive portion pressing portion 301111, and one of the insulating position molding portions 30112 is located between the first conductive portion pressing portion 301111 and an adjacent second conductive portion pressing portion 301112.

According to some embodiments of the present disclosure, the insulating position molding portion 30112 is located between the second conductive portion pressing portion 301112 and the adjacent second conductive portion pressing portion 301112.

The lower mold 302 includes a lower molding portion 3021 and a lower pressing portion 3022. provided at a peripheral position of the lower molding portion 3021 so that the lower pressing portion 3022 of the lower mold 302 can support the upper pressing portion 3012 of the upper mold 301 when the molding die 300 is subjected to a mold closing process.

The lower molding portion 3021 includes at least one supporting portion 30211 and at least one lower molding guide portion 30212. The supporting portion 30211 and the lower molding guide portion 30212 are provided at intervals. The supporting portion 30211 corresponds to the lower surface of the conductive portion 11, and the lower molding guide portion 30212 corresponds to the insulating position molding portion 30112. The molding space 303 is formed between the lower molding guide portion 30212 and the insulating position molding portion 30112 to form the insulating portion 12 integrally bonded to conductive portion 11 in a subsequent step.

Further, the supporting portion 30211 includes a first conductive portion supporting portion 302111 and a second conductive portion supporting portion 302112. Alternatively, when the number of the conductive portions 11 is a plurality, at least one lower molding guide portion 30212 is located between the first conductive portion supporting portion 302111 and an adjacent second conductive portion supporting portion 302112, at least one lower molding guide portion 30212 is located between the first conductive portion supporting portion 302111 and an adjacent first conductive portion supporting portion 302111, and at least one lower molding guide portion 30212 is located between the second conductive portion supporting portion 302112 and an adjacent second conductive portion supporting portion 302112.

When a mold closing operation is performed by the molding die 300, the distance between the conductive portion pressing portion 30111 of the upper molding portion 3011 of the upper mold 301 and the supporting portion 30211 of the lower molding portion 3021 of the lower mold 302 is set to exactly accommodate the conductive portion 11, so as to avoid contamination of the upper surface of the conductive portion 11 by the fluid material.

In this example, the insulating portion 12 integrally formed on the conductive portion 11 can not only separate the first conductive portion 111 from the second conductive portion 112, but also cover the side surface of the conductive portion 11. In other embodiments of the present disclosure, the insulating portion 12 integrally molded to the conductive portion 11 separates the first conductive portion 111 and the second conductive portion 112, and covers a portion of the side surface of the conductive portion 11. In other embodiments of the present disclosure, the insulating portion 12 integrally molded to the conductive portion 11 is formed only on the first conductive portion 111 and the second conductive portion 112 of the conductive portion 11.

Further, the molding die 300 may further include at least one film layer 304. For example, in this particular example of the present disclosure, the number of film layers 304 may be implemented as two, wherein one of the film layers 304 is disposed on the lower surface of the upper mold 301 and the one film layer 304 and the lower surface of the upper mold 301 overlap each other, and the other one of the film layers 304 is disposed on the inner surface of the lower mold 302 and the other one film layer 304 and the upper surface of the lower mold 302 overlap each other. The film layer 304 may be attached to the lower surface of the upper mold 301 such that the film layer 304 and the inner surface of the upper mold 301 are connected to each other in an overlapping manner, and the film layer 304 may be attached to the upper surface of the lower mold 302 such that the film layer 304 and the upper surface of the lower mold 302 are connected to each other in an overlapping manner.

The film layer 304 can act as a buffer to reduce damage, such as scratches, to the conductive portion 11 during production.

When the molding die 300 is subjected to a mold closing operation, the film layers 304 are held between the conductive portion 11 and the conductive portion pressing portion 30111 of the upper molding portion 3011 of the upper mold 301, and between the conductive portion 11 and the supporting portion 30211 of the lower molding portion 3021 of the lower mold 302, respectively, so that the film layers 304 prevent a gap from being formed between the upper and lower molds 301 and 302 and the conductive portion 11 by deforming during compression, whereby the fluid material is prevented from entering the upper surface and the lower surface of the conductive portion 11 in a subsequent molding process. Therefore, both the upper and lower sides of the circuit board assembly 1 that is finally formed can be directly conducted through the conductive portion 11, thereby avoiding contamination of the conductive portion 11, particularly the upper surface of the conductive portion 11, to ensure product yield of the circuit board assembly 1.

The upper pressing portion 3012 of the upper mold 301 and the lower pressing portion 3022 of the lower mold 302 are directly pressed together after the molding die 300 performs a mold closing operation, and the molding space 303 is formed between the conductive portion 11 and the upper mold 301 and the lower mold 302.

In this example, the adjacent conductive portions 11 are independent of each other, and each of the conductive portions 11 is independently placed in a preset position on the lower mold 302 and then injected with a fluid material after the mold is closed.

In other examples of the present disclosure, the upper surface of the conductive portion 11 is not a flat surface and has a recess in which the electronic component can be received to reduce the overall height of the assembled electronic component and the circuit board assembly 1. Accordingly, the structure and shape of the molding die 300 may be adjusted accordingly.

In other embodiments of the present disclosure, adjacent conductive portions 11 are interconnected to facilitate placement of the conductive portions 11 in the molding die 300.

With continued reference to FIG. 2A, the fluid material is added to at least one of the molding spaces 303, and the fluid material fills all of the molding spaces 303 by a transfer molding process or a press molding process to form the insulating portion 12, so that the insulating portion 12 and the conductive portion 11 are integrally molded.

The fluid material may be a liquid, a solid, or a solid-liquid mixture, or the like, so that the fluid material may flow. The fluid material may be a thermoset material. Of course, it will be appreciated by those skilled in the art that the material of the fluid material is not limited thereto.

With continued reference to FIG. 2A, the mold drawing operation may be performed by the molding die 300, and the upper mold 301 may be drawn first, as shown in FIG. 2A.

With continued reference to FIG. 2B, the semi-finished product of the circuit board assembly is obtained after a mold drawing operation is performed by the molding die 300. The semi-finished product of the circuit board assembly may be cut to obtain a single circuit board assembly 1.

In other embodiments of the present disclosure, the junction of the adjacent conductive portions 11 is a complete metal block, that is, the second conductive portion 112 of one of the conductive portions 11 is in direct contact with the second conductive portion 112 of the adjacent one conductive portion 11. In a subsequent cutting process, it is necessary to divide the metal block composed of two of the second conductive portions 112.

More specifically, in some examples of the present disclosure, the insulating portion 12 of the circuit board assembly 1 can be observed at one end of the upper surface of the circuit board assembly 1 only between the first conductive portion 111 and the second conductive portion 112. In the manufacturing process, the adjacent first conductive portions 111 is a complete metal plate, and the adjacent second conductive portion 112 is a complete metal plate. Even in some variant embodiments, the first conductive portion 111 of one conductive portion 11 and the second conductive portion 112 of the adjacent one conductive portion 11 are a complete metal plate. By subsequent cutting, the single conductive portion 11 and the circuit board assembly 1 with the single conductive portion 11 are obtained.

Further, in this example, in the lateral direction, the second conductive portions 112 of the adjacent conductive portions 11 are disposed adjacent to each other, and the first conductive portions 111 of the adjacent conductive portions 11 are disposed adjacent to each other. During the cutting process, a single circuit board assembly 1 may be obtained, or a plurality of circuit board assemblies 1 may be obtained to meet the needs of some arrayed electronic devices.

In other examples of the present disclosure, in the lateral direction, the first conductive portion 111 and the second conductive portion 112 of the adjacent conductive portions 11 are provided at intervals, that is, the first conductive portion 111 of one of the conductive portions 11 is adjacent to the second conductive portion 112 of the adjacent conductive portion 11.

According to another aspect of the present disclosure, there is further provided a method of manufacturing a circuit board assembly 1 for supporting an electronic component, The method includes the steps of:
- (a) placing at least one conductive portion 11 into a molding die 300;
- (b) performing a mold closing process by the molding mold 300 to form a molding space 303 between the conductive portion 11 and an upper mold 301 and a lower mold 302 of the molding die 300;
- (c) adding a fluid material to the molding space 303 so that the fluid material fills the molding space 303 and solidifies within the molding space 303; and
- (d) after a mold drawing process is performed by the molding die 300, at least one insulating portion 12 integrally bonded to the circuit board assembly 1 is formed on the circuit board assembly 1.

According to an embodiment of the invention, the step (d) further includes the steps of:

Performing a mold drawing process by the molding die 300 to form a semi-finished product of the circuit board assembly, which includes a plurality of conductive portions 11 and the insulating portions 12 integrally bonded to the conductive portions 11; and Cutting the semi-finished product of the circuit board assembly to obtain the circuit board assembly 1.

According to an embodiment of the present disclosure, in the above method, at least a part of the insulating portion 12 is located between the first conductive portion 111 and the second conductive portion 112 to separate the first conductive portion 111 and the second conductive portion 112.

According to an embodiment of the present disclosure, in the above method, at least a part of the insulating portion 12 is formed on at least a part of the side surface of the conductive portion 11.

According to art embodiment of the present disclosure, the step (d) is implemented as: after the mold drawing process is performed by the molding die, the insulating portion 12 integrally bonded to the conductive portion 11 and a bracket 20 integrally bonded to the insulating portion 12 are formed on the conductive portion 11.

According to an embodiment of the present disclosure, in the above method, the insulating portion 12 integrally bonded to a side surface of the conductive portion 11 is formed on the conductive portion 11.

According to an embodiment of the present disclosure, in the step (d), the insulating portion 12 integrally bonded to a side surface and an upper surface of the conductive portion 11 is formed on the conductive portion 11. The upper surface of the conductive portion 11 is used to support the electronic component.

According to an embodiment of the present disclosure, in the step (d), the insulating portion 12 integrally bonded to a side surface and a lower surface of the conductive portion 11 is formed on the conductive portion 11.

According to an embodiment of the present disclosure, the method further includes a step of reducing the thickness of the insulating portion 12 to expose the lower surface of the conductive portion 11.

According to an embodiment of the present disclosure, the method further includes a step of reducing the thickness of the insulating portion 12 to expose the upper surface of the conductive portion 11.

According to an embodiment of the present disclosure, the method further includes a step of reducing the thickness of the insulating portion 12 to expose the side surface of the conductive portion 11.

According to an embodiment of the present disclosure, in the above method, the conductive portion 11 includes a first conductive portion 111 and a second conductive portion 112, and at least part of the insulating layer 12 separates the first conductive portion 111 and the second conductive portion 112.

According to an embodiment of the present disclosure, in the above method, each of the conductive portions 11 is independent of each other.

According to an embodiment of the present disclosure, in the above method, a conductive portion 11 is connected to an adjacent conductive portion 11.

Further, it will be appreciated that in the present embodiment, the upper mold 301 corresponds to the upper surface of the conductive portion 11, and the lower mold 302 corresponds to the lower surface of the conductive portion 11. That is, the conductive portion 11 is flip-loaded into the lower mold 302. In other examples of the present disclosure, the conductive portion 11 may be directly loaded into the lower mold 302, that is, the upper mold 301 corresponds to the lower surface of the conductive portion 11, and the lower mold 302 corresponds to the upper surface of the conductive portion 11.

Figure 3:
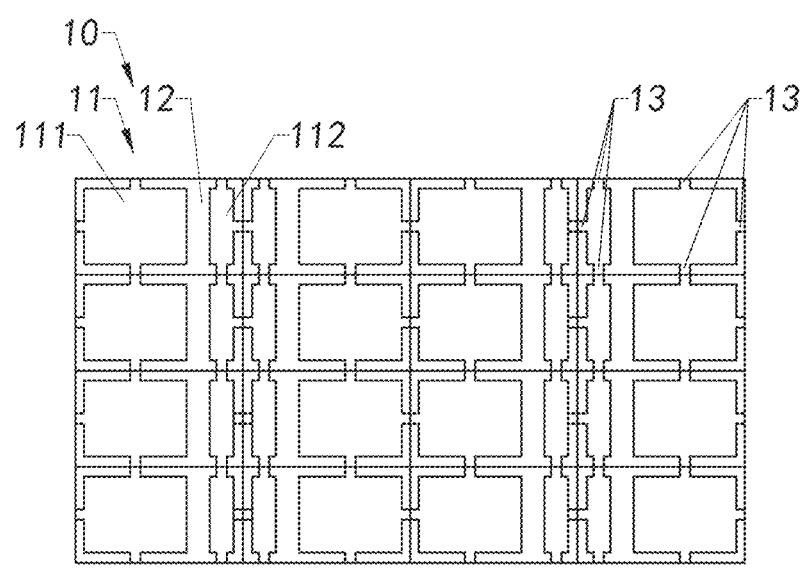
FIG. 3 is a schematic diagram of a semi-finished product of a circuit board assembly according to an embodiment of the present disclosure.

FIG. 3 shows another embodiment of a semi-finished product of the circuit board assembly according to the present disclosure, and FIGS. 2A and 2B are taken as reference at the same time.

In this example, the semi-finished product of the circuit board assembly includes a plurality of the conductive portions 11 and the insulating portions 12 integrally bonded to the conductive portions 11.

Note that, in this example, the conductive portions 11 are interconnected to facilitate rapid placement of the conductive portions 11 in the lower mold 302. A plurality of the conductive portions 11 are connected to each other to form a frame, and when the conductive portions 11 need to be placed in the lower mold 302 for operation, the placement of the conductive portions 11 can be completed in one operation, thereby saving operation time and improving work efficiency.

The semi-finished product of the circuit board assembly further includes connecting members 13 connecting to each of the adjacent conductive portions 11. Depending on the connection position, the connecting members 13 may be divided into first connecting members connected to the first conductive portion 111 of the adjacent conductive portion 11 and second connecting members connected to the second conductive portion 112 of the adjacent conductive portion 11.

Specifically, the first conductive portion 111 of the conductive portion 11 is connected to the first conductive portion 111 of the adjacent conductive portion 11 through a first connecting member, and the second conductive portion 112 of the conductive portion 11 is connected to the second conductive portion 112 of the other conductive portion 11 through a second connecting member. There is no direct contact between the first conductive portion 111 and the second conductive portion 112 of the same conductive portion 11.

Preferably, in the present example, the first conductive portion 111 and the second. conductive portion 112 have the same height so that the final circuit board assembly 1 has a flat surface.

The height of the first connecting member is set to be lower than the height of the first conductive portion 111, and the height of the second connecting member is set to be lower than the height of the second conductive portion 112.

The molding space 303 includes at least one transverse guide groove and at least one longitudinal guide groove. The transverse guide groove and the longitudinal guide groove are perpendicular to each other and communicates with each other for the flow of the fluid material therethrough to fill the entire molding die 300. The first connecting member and the second connecting member span the transverse guide groove and the longitudinal guide groove, respectively. When the heights of the first connecting member and the second. connecting member are lower than that of the surrounding first conductive portion 111 and the second conductive portion 112, respectively, the fluid material can pass directly through the gap between the molding die 300 and the first connecting member and the second connecting member, so that for the entire molding die 300, a single one of the transverse guide grooves or a single one of the longitudinal guide grooves can be completely penetrated, and the entire process of injecting the fluid material can be completed by injecting from one side of the molding die 300.

In some examples of the present disclosure, the heights of the first connecting member and the second connecting member are equal to the height of the conductive portion 11, and the transverse guide groove and the longitudinal guide groove cannot be penetrated, so that the molding space 303 is divided into a single separate space. The injection of the fluid material can be performed in the upper and lower directions of the molding die 300 for the single separate space, so that the fluid material finally fills the entire molding space 303.

Figure 4:
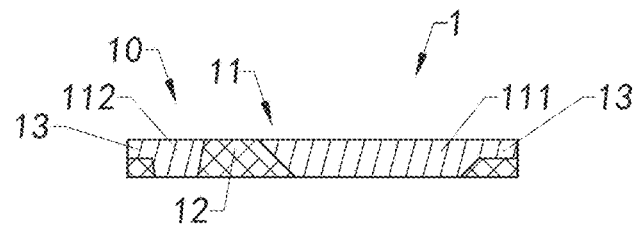
FIG. 4 is a schematic diagram of a circuit board assembly according to an embodiment of the present disclosure.

Another embodiment of the circuit board assembly 1 according to the present disclosure is shown in FIG. 4.

The circuit board assembly 1 includes a circuit board 10. The circuit board 10 includes a conductive portion 11 and an insulating portion 12. The insulating portion 12 is integrally coupled to the conductive portion 11. The conductive portion 11 includes a first conductive portion 111 and a second conductive portion 112. The first conductive portion 111 is separated from the second conductive portion 112 by at least a portion of the insulating portion 12.

The longitudinal section of the first conductive portion 111 is an inverted trapezoid. The first conductive portion 111 has an upper surface, a lower surface and a side surface, wherein an area of the upper surface is larger than an area of the lower surface, and the side surface is provided inclined inwardly.

The inclined side surface enables the first conductive portion ill to be better supported on the insulating portion 12 to facilitate the bonding strength between the first conductive portion 111 and the insulating portion 12.

The circuit board 10 further includes at least a part of the connecting members 13. The circuit board assembly 1 is obtained by cutting the semi-finished product of the circuit board assembly, so that a part of the connecting member 13 is left in a single circuit board assembly 1, and the connecting member 13 is connected to the first conductive part 111 and the second conductive part 112, respectively.

Further, in other examples of the present disclosure, the second conductive portion 112 may also be designed in a specific shape to facilitate the bond strength between the second conductive portion 112 and the insulating portion 12. The second conductive portion 112 may be formed in a step-like structure on the side surface, or the second conductive portion 112 is designed in an inverted trapezoidal shape in a longitudinal section.

Figure 5A:
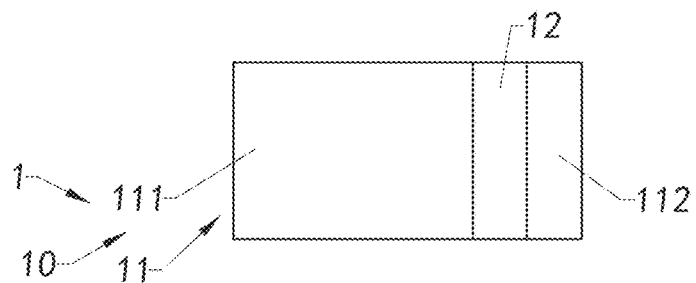
FIG. 5A is a schematic diagram of a circuit board assembly according to an embodiment of the present disclosure.

Another embodiment of the circuit board assembly 1 according to the present disclosure is shown with reference to FIG. 5A, and with reference to FIG. 3.

The circuit board assembly 1 includes a circuit board 10. The circuit board 10 includes a conductive portion 11 and an insulating portion 12. The insulating portion 12 is integrally formed on the conductive portion 11, and the conductive portion 11 extends through the insulating portion 12. The conductive portion 11 includes a first conductive portion 111 and a second conductive portion 112, and at least a portion of the insulating portion 12 is located between the first conductive portion 111 and the second conductive portion 112 and encloses the first conductive portion 111 and the second conductive portion 112.

A part of the insulating portion 12 is supported on a part of the lower surface of the first conductive portion 111. In other words, the part of the insulating portion 12 that is not located between the first conductive portion 111 and the second conductive portion 112 does not contribute to the increase in the area size of the entire circuit board assembly 1.

The conductive portion 11 and the insulating portion 12 have the same height, and each of the conductive portion 11, the insulating portion 12 and the circuit board assembly 1 has a cubic structure. It will be appreciated that the first conductive portion 111 and the second conductive portion 112 of the conductive portion 11 may be circular, triangular, or polygonal, and the foregoing description of shape does not limit the present disclosure.

Note that in this example, during the cutting process of the semi-finished product of the circuit board assembly, it is possible to cut along the circumference of the first conductive portion 111 and the second conductive portion 112 so that the connecting member 13 does not appear in the final circuit board assembly 1.

Figure 5B:
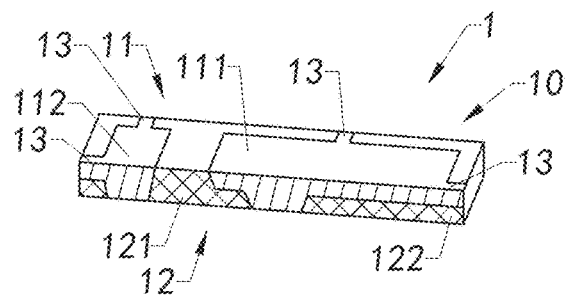
FIG. 5B is a schematic diagram of a circuit board assembly according to an embodiment of the present disclosure.

Another embodiment of the circuit board assembly 1 according to the present disclosure is shown with reference to FIG. 5B, and with reference to FIG. 3.

The circuit board assembly 1 includes a circuit board 10. The circuit board 10 includes a conductive portion 11 and an insulating portion 12. The insulating portion 12 is integrally molded to the conductive portion 11, and the conductive portion 11 extends through the insulating portion 12.

The insulating portion 12 includes an insulating body 121 and an insulating frame 122. The insulating body 121 forms on the outer side of the conductive portion 11 and increases the size of the area of the circuit board assembly 1 in the horizontal direction. The insulating frame 122 is integrally formed with the insulating body 121. The insulating body 121 contributes to increasing the size of the circuit board assembly 1 in the vertical direction.

The insulating frame 122 is formed on a side surface of the conductive portion 11. In other words, the side surface of the conductive portion 11 is completely wrapped with an insulating material.

The conductive portion 11 includes a first conductive portion 111 and a second conductive portion 112, and a portion of the insulating portion 12 is located between the first conductive portion 111 and the second conductive portion 112 and encloses the first conductive portion 111 and the second conductive portion 112. A part of the insulating portion 12 is supported on the first conductive portion 111.

An upper surface of the second conductive portion 112 is larger than a lower surface of the second conductive portion 112 to facilitate reduction of the contact area between the upper surface of the second conductive portion 112 and other circuit boards.

The circuit board assembly 1 further includes at least a part of the connecting members 13. The connecting members 13 are connected to the side surface of the first conductive portion 111 and the second conductive portion 112, respectively.

In other embodiments of the present disclosure, a part of the insulating body 121 is supported by the second conductive portion 112.

Figure 5C:
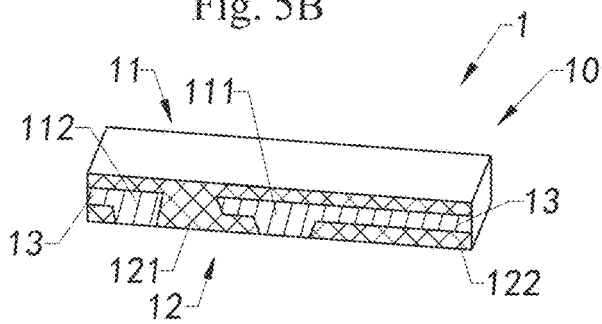
FIG. 5C is a schematic diagram of a circuit board assembly according to an embodiment of the present disclosure.

Another embodiment of the semi-finished product of the circuit board assembly according to the present disclosure is shown with reference to FIG. 5C, and with reference to FIG. 3.

Here, a single circuit board assembly 1 is illustrated, but in fact the semi-finished product of the circuit board assembly may include a plurality of circuit board assemblies 1.

The circuit board assembly 1 includes a circuit board 10. The circuit board 10 includes a conductive portion 11 and an insulating portion 12. The insulating portion 12 is integrally molded to the conductive portion 11. The conductive portion 11 includes an upper surface, a lower surface and a side surface, wherein the upper surface and the lower surface are oppositely disposed, and the side surface is connected to the upper surface and the lower surface and formed between the upper surface and the lower surface.

In this example, a part of the insulating portion 12 is wrapped around the upper surface of the conductive portion 11 so that the conductive portion 11 cannot penetrate through the insulating portion 12.

The circuit board assembly 1 further includes at least a part of the connecting members 13. The connecting members 13 are connected to the side surfaces of the first conductive portion 111 and the second conductive portion 112, respectively.

Further, the manufacturing process of the semi-finished product of the circuit board assembly includes a step of:

Exposing the upper surface of the conductive portion 11 so that an electronic component can be communicated to the upper surface of the conductive portion 11.

The insulating portion 12 located on the upper surface of the conductive portion 11 may be removed by a process such as grinding or cutting.

It will be appreciated that the semi-finished product of the circuit board assembly may be first cut into a single or a plurality of the circuit board assemblies 1 and then exposing the upper surface of the conductive portion 11 by grinding or cutting. Alternatively, the upper surface of the conductive portion 11 may be exposed by grinding or cutting, and then divided the semi-finished product of the circuit board assembly into a single or a plurality of the circuit board assemblies 1. It will be appreciated that the upper surface of the insulating portion 12 can be completely removed so that the height is reduced to expose the upper surface of the conductive portion 11. Alternatively, the position of the insulating portion 12 corresponding to the conductive portion 11 may be removed to form a groove for exposing the upper surface of the conductive portion 11, and the groove may be used to prevent glue spill when the electronic component is mounted.

Figure 5D:
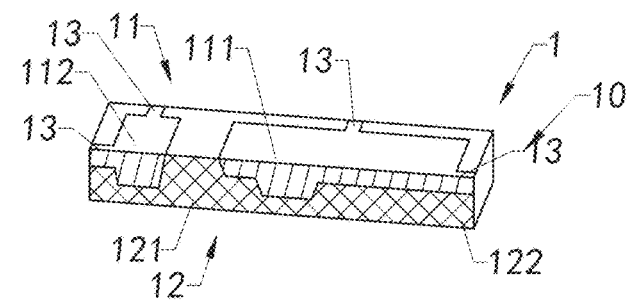
FIG. 5D is a schematic diagram of a circuit board assembly according to an embodiment of the present disclosure.

Another embodiment of the semi-finished product of the circuit board assembly according to the present disclosure is shown with reference to FIG. 5D, and with reference to FIG. 3.

Here, a single circuit board assembly 1 is illustrated, but in fact the semi-finished product of the circuit board assembly may include a plurality of circuit board assemblies 1.

The circuit board assembly 1 includes a circuit board 10. The circuit board 10 includes a conductive portion 11 and an insulating portion 12. The insulating portion 12 is integrally molded the conductive portion 11. The conductive portion 11 includes an upper surface, a lower surface, and a side surface, wherein the upper surface and the lower surface are oppositely disposed, and the side surface is connected to the upper surface and the lower surface and formed between the upper surface and the lower surface.

In this example, a part of the insulating portion 12 is wrapped around the lower surface of the conductive portion 11 so that the conductive portion 11 cannot penetrate through the insulating portion 12.

The circuit board assembly 1 further includes at least a part of the connecting members 13. The connecting members 13 are connected to the side surfaces of the first conductive portion 111 and the second conductive portion 112, respectively.

Further, the manufacturing process of the semi-finished product of the circuit board assembly includes a step of:

Exposing the lower surface of the conductive portion 11 so that an electronic component can be communicated to the lower surface of the conductive portion 11.

The insulating portion 12 located on the lower surface of the conductive portion 11 may be removed by a process such as grinding or cutting.

It will be appreciated that the semi-finished product of the circuit board assembly may be first cut into a single or a plurality of the circuit board assemblies 1 and then exposing the lower surface of the conductive portion 11 by grinding or cutting. Alternatively, the lower surface of the conductive portion 11 may be exposed by grinding or cutting, and then divided the semi-finished product of the circuit board assembly into a single or a plurality of the circuit board assemblies 1.

It will be appreciated that in some examples of the present disclosure, a portion of the insulating portion 12 is wrapped around the side surface of the conductive portion 11, and the side surface of the conductive portion 11 may be exposed to the outside by cutting or grinding.

Figure 6:
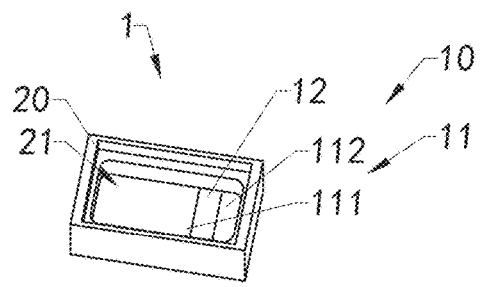
FIG. 6 is a schematic diagram of a circuit board assembly according to an embodiment of the present disclosure.

FIG. 6 shows an embodiment of a circuit board assembly 1 according to the invention.

The circuit board assembly 1 includes a circuit board 10 and a bracket 20. The bracket 20 is integrally coupled to the circuit board 10 and the bracket 20 surrounds to form a light window 21. The circuit board assembly 1 includes a conductive portion 11 and an insulating portion 12, and the insulating portion 12 is integrally bonded to the conductive portion 11.

The conductive portion 11 includes a first conductive portion 111 and a second conductive portion 112. The first conductive portion 111 and the second conductive portion 112 are separated by a portion of the insulating portion 12. The bracket 20 is integrally molded on a side surface of the conductive portion 11.

In the present example, the insulating portion 12 and the bracket 20 are integrally coupled to the conductive portion 11, and the insulating portion 12 and the bracket 20 are made of the same material. The bracket 20 on the outer side may protect the conductive portion 11. The bracket 20 prevents dust and the like from falling on an electronic component on the upper surface of the conductive portion 11, and may also prevent malfunctions, such as a short circuit, on the side surface of the circuit board assembly 1.

In other examples of the present disclosure, the bracket 20 is connected to the conductive portion 11 of the circuit board assembly 1. Alternatively, the bracket 20 is connected to the insulating portion 12 of the circuit board assembly 1. Alternatively, the bracket 20 is connected to the conductive portion 11 and the insulating portion 12 of the circuit board assembly 1. The bracket 20 may be connected by a connecting medium such as glue.

Figure 7:
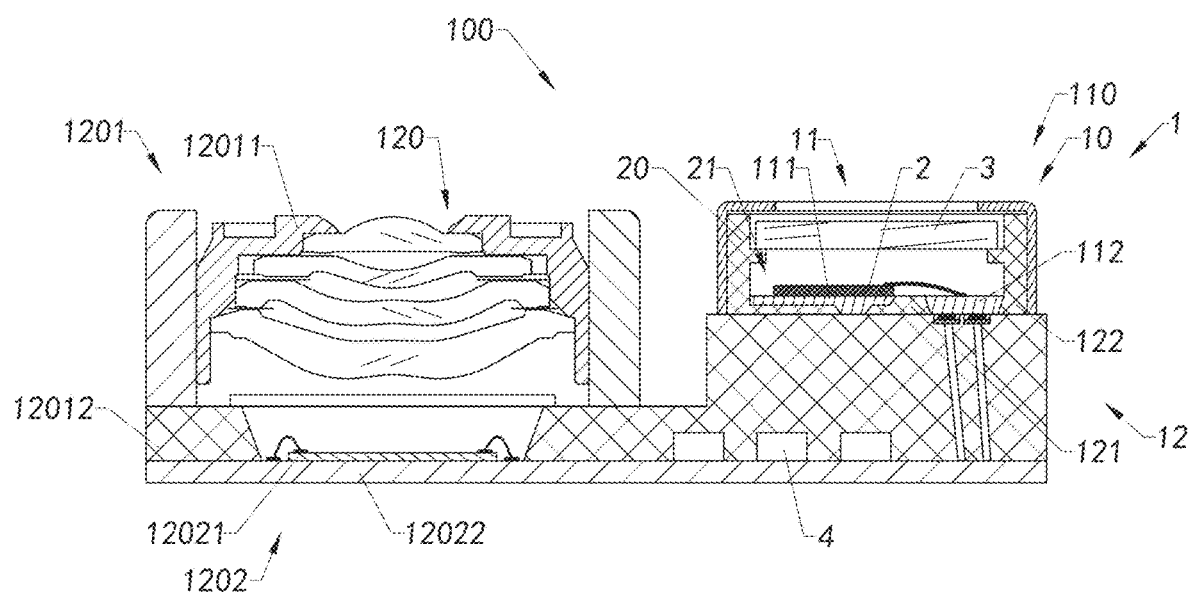
FIG. 7 is a schematic diagram of a TOF camera module with a circuit board assembly according to an embodiment of the present disclosure.

Referring to FIG. 7, an application of the circuit board assembly 1, a TOF camera module 100, according to the present disclosure is shown.

The TOF camera module 100 includes a floodlight 110 for generating a light ray to a subject to be photographed, the light ray being reflected by the subject, and a receiving unit 120 for receiving the reflected light ray and obtaining depth information of the subject to be photographed according to the information of the emitted light ray and the reflected light ray.

The receiving unit 120 includes a lens assembly 1201 for receiving light and a photosensitive circuit 1202 for receiving the light and converting the optical signal to an electrical signal based on a photoelectric conversion principle.

The lens assembly 1201 further includes an optical lens 12011 and a base 12012, and the photosensitive circuit 1202 includes a photosensitive element 12021 and a circuit board 12022. The optical lens 12011 and the floodlight 110 are respectively supported on the base 12012. The photosensitive element 12021 is conductively connected to the circuit board 12022. In this example, the base 12012 is integrally molded to the circuit board 12022. The floodlight 110 is conductively connected to the base 12012.

In the present embodiment, the electronic component is implemented as a light-emitting element 2. The floodlight 110 includes the light-emitting element 2 and the circuit board assembly 1. The light-emitting element 2 is supported by the circuit board assembly 1 and communicably connected to the circuit board assembly 1. The circuit board assembly 1 provides a light-passing path, and the light-emitting element 2 can be excited to emit light outward through the light-passing path after being powered.

The circuit board assembly 1 includes a circuit board 10 and a bracket 20. The bracket 20 is supported by the circuit board 10. The bracket 20 has a light window 21. The light-emitting element 2 cooperates with the bracket 20 to form the light window 21 so that light is emitted outwardly through the light window 21.

The light-emitting element 2 has a front surface and a back surface. The front surface of the light-emitting element 2 is communicated with the second conductive portion 112 of the conductive portion 11 through a wire, and the back surface of the light-emitting element 2 is directly supported by the first conductive portion 111 of the conductive portion 11 and communicated with the conductive portion 11.

The floodlight 110 further includes an optical auxiliary element 3. The bracket 20 supports the optical auxiliary element 3 on the circuit board assembly 1 and the optical auxiliary element 3 is held in a light-passing path of the light-emitting element 2. The optical auxiliary element 3 is used to change or improve the light emitted by the light-emitting element 2, for example, to change the light emitted by the light-emitting element 2 in a refractive, diffractive and filter manner. The optical auxiliary element 3 may be a refractive lens or a diffractive lens. It will be appreciated by those skilled in the art that the above examples do not limit the type of the optical auxiliary element 3.

The floodlight 110 further includes at least one electronic device 4. The electronic device 4 is conductively connected to the circuit board assembly 1. In this example, at least part of the electronic device 4 is disposed on the circuit board 12022 of the receiving unit 120 and is covered by the base 12012. The electronic device 4 is conductively connected to the circuit board assembly 1. Specifically, the electronic device 4 is conductively connected to the circuit board assembly 1 of the floodlight 110 through the circuit board 12022 of the receiving unit 120.

Further, in some examples of the present disclosure, the light-emitting element 2 may be implemented as a Vertical-Cavity Surface-Emitting Laser (VCSEL). After energization, the Vertical-Cavity Surface-Emitting Laser can be energized to emit laser light.

It should be noted that the Vertical-Cavity Surface-Emitting Laser needs to be maintained at a certain temperature range to be able to operate normally, that is, the heat dissipation performance of the circuit board assembly 1 is important to the operating state of the Vertical-Cavity Surface-Emitting Laser. Since the first conductive portion 111 of the circuit board assembly 1 provides a large heat dissipation area, the Vertical-Cavity Surface-Emitting Laser can operate normally when supported on the first conductive portion 111.

Further, a back surface of the Vertical-Cavity Surface-Emitting Laser is a negative electrode, and a front surface of the Vertical-Cavity Surface-Emitting Laser is a positive electrode. When the Vertical-Cavity Surface-Emitting Laser is respectively communicated with the first conductive portion 111 and the second conductive portion 112, the first conductive portion 111 is a negative electrode, and the second conductive portion 112 is a positive electrode.

Figure 8A:
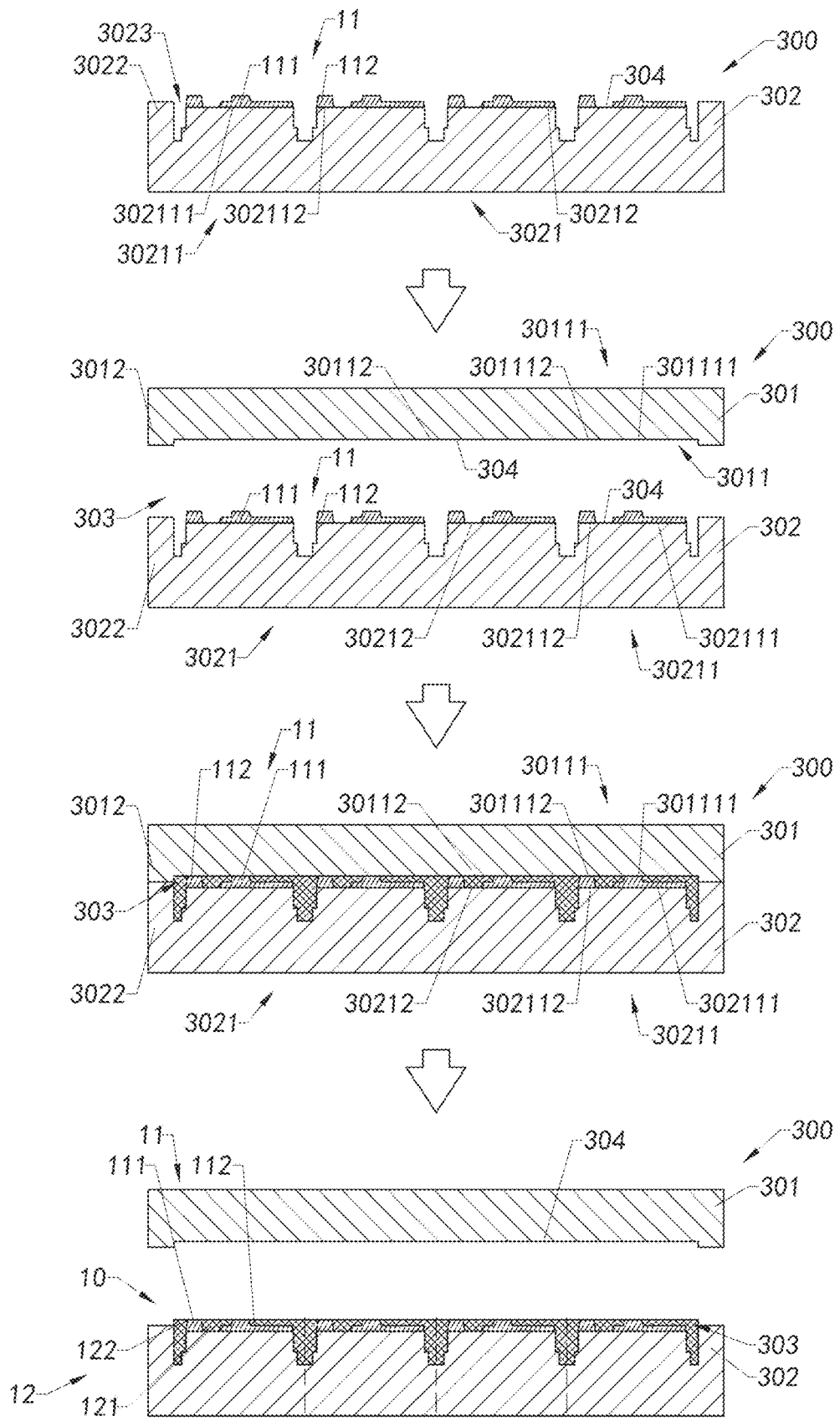
FIG. 8A is a schematic diagram of a manufacturing process of a circuit board assembly according to an embodiment of the present disclosure.
Figure 8B:
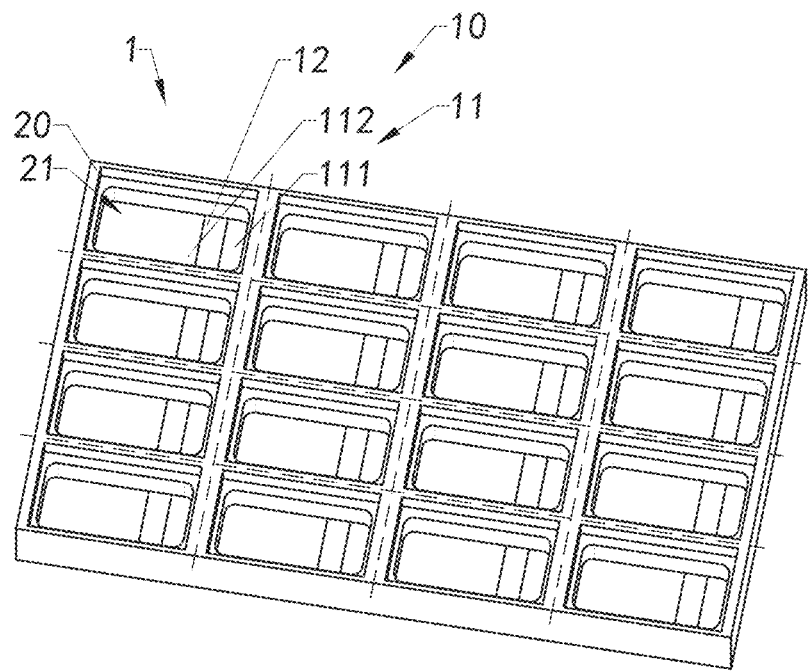
FIG. 8B is a schematic diagram of a manufacturing process of a circuit board assembly according to an embodiment of the present disclosure.
Figure 8B:
Figure 8B:
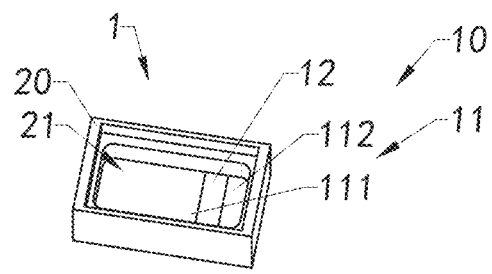

FIGS. 8A and 8B show a manufacturing process of the circuit board assembly 1 according to the present disclosure.

At the stage shown in FIG. 8A, at least one conductive portion 11 is attached to a molding die 300 to perform a molding process by the molding die.

Specifically, the molding die 300 includes an upper mold 301 and a lower mold 302. At least one of the upper mold 301 and the lower mold 302 can be operated to enable the molding die 300 to be subjected to mold closing and drawing operations. For example, in one embodiment of the present disclosure, a molding space 303 is formed between the upper mold 301 and the lower mold 302 after the conductive portion 11 is placed in the lower mold 302 and the upper mold 301 is subjected to a mold closing operation. That is, the lower mold 302 and the upper mold 301 communicate with each other after performing a mold closing operation. The upper mold 301, the lower mold 302 and the conductive portion 11 define the molding space 303. A fluid material can fill the molding space 303 to form the insulating portion 12 integrally bonded to the conductive portion 11.

With continued reference to FIG. 8A, the upper mold 301 further includes an upper molding portion 3011 and an upper pressing portion 3012. The upper pressing portion 3012 is provided at the periphery of the upper molding portion 3011 so that the upper pressing portion 3012 of the upper mold 301 can be pressed against an upper surface of the upper mold 301 after the molding die 300 is subjected to a mold closing process.

The upper molding portion 3011 has a lower surface. When the molding die 300 is subjected to a mold closing process, a part of the lower surface of the upper molding portion 3011 is pressed against the conductive portion 11, and the part of the lower surface of the upper molding portion 3011 and an upper surface of a corresponding part of the lower mold 302 form the molding space 303 for passage of the fluid material.

In this example, since the upper and lower surfaces of the circuit board assembly 1 are flat, the corresponding lower surface of the upper molding portion 3011 and the corresponding upper surface of the lower molding portion 3021 are flat. The structure of the entire molding die 300 is simple, and the manufacturing difficulty and the manufacturing cost are low.

Further, the upper molding portion 3011 includes at least one conductive portion pressing portion 30111 and at least one insulating position molding portion 30112. The conductive portion pressing portion 30111 integrally extending to the insulating position molding portion 30112. The conductive portion pressing portion 30111 further includes a first conductive portion pressing portion 301111 and a second conductive portion pressing portion 301112. One of the insulating position molding portions 30112 is located between the first conductive portion pressing portion 301111 and an adjacent first conductive portion pressing portion 301111, one of the insulating position molding portions 30112 is located between the first conductive portion pressing portion 301111 and an adjacent second conductive portion pressing portion 301112, and one of the insulating position molding portions 30112 is located between the second conductive portion pressing portion 301112 and an adjacent second conductive portion pressing portion 301112.

The lower mold 302 includes a lower molding portion 3021 and a lower pressing portion 3022 provided at a peripheral position of the lower molding portion 3021 so that the lower pressing portion 3022 of the lower mold 302 can support the upper pressing portion 3012 of the upper mold 301 when the molding die 300 is subjected to a mold closing process.

The lower mold 302 further includes a lower molding guide groove 3023 formed between the lower pressing portion 3022 and the lower molding portion 3021 or between the lower molding portion 3021 and an adjacent lower molding portion 3021.

The lower molding portion 3021 includes at least one supporting portion 30211 and at least one lower molding guide portion 30212. The supporting portion 30211 and the lower molding guide portion 30212 are provided at intervals. The supporting portion 30211 corresponds to the lower surface of the conductive portion 11, and the lower molding guide portion 30212 corresponds to the insulating position molding portion 30112 and the lower molding guide groove 3023. The molding space 303 is formed between the insulating position molding portion 30112 and the lower molding guide portion 30212 and the lower molding guide groove 3023 to form the insulating portion 12 and the bracket 20 integrally bonded to the conductive portion 11 in a subsequent step.

Further, the supporting portion 30211 includes a first conductive portion supporting portion 302111 and a second conductive portion supporting portion 302112. Alternatively, when the number of the conductive portions 11 is a plurality, at least one lower molding guide portion 30212 is located between the first conductive portion supporting portion 302111 and an adjacent second conductive portion supporting portion 302112, at least one lower molding guide portion 30212 is located between the first conductive portion supporting portion 302111 and an adjacent first conductive portion supporting portion 302111, and at least one lower molding guide portion 30212 is located between the second conductive portion supporting portion 302112 and an adjacent second conductive portion supporting portion 302112.

When a mold closing operation is performed by the molding die 300, the distance between the conductive portion pressing portion 30111 of the upper molding portion 3011 of the upper mold 301 and the supporting portion 30211 of the lower molding portion 3021 of the lower mold 302 is set to exactly accommodate the conductive portion 11, so as to avoid contamination of the upper surface of the conductive portion 11 by the fluid material.

In this example, the insulating portion 12 integrally formed on the conductive portion 11 can not only separate the first conductive portion 111 from the second conductive portion 112, but also cover the side surface of the conductive portion 11. In other embodiments of the present disclosure, the insulating portion 12 integrally molded to the conductive portion 11 separates the first conductive portion 111 and the second conductive portion 112, and covers a portion of the side surface of the conductive portion 11. In other embodiments of the present disclosure, the insulating portion 12 integrally molded to the conductive portion 11 is formed only on the first conductive portion 111 and the second conductive portion 112 of the conductive portion 11.

Further, the molding die 300 may further include at least one film layer 304. For example, in this particular example of the present disclosure, the number of film layers 304 may be implemented as two, wherein one of the film layers 304 is disposed on the lower surface of the upper mold 301 and the one film layer 304 and the lower surface of the upper mold 301 overlap each other, and the other one of the film layers 304 is disposed on the inner surface of the lower mold 302 and the other one film layer 304 and the upper surface of the lower mold 302 overlap each other. The film layer 304 may be attached to the lower surface of the upper mold 301 such that the film layer 304 and the inner surface of the upper mold 301 are connected to each other in an overlapping manner, and the film layer 304 may be attached to the upper surface of the lower mold 302 such that the film layer 304 and the upper surface of the lower mold 302. are connected to each other in an overlapping manner.

The film layer 304 can act as a buffer to reduce damage, such as scratches, to the conductive portion 11 during production.

When the molding die 300 is subjected to a mold closing operation, the film layers 304 are held between the conductive portion 11 and the conductive portion pressing portion 30111 of the upper molding portion 3011 of the upper mold 301, and between the conductive portion 11 and the supporting portion 30211 of the lower molding portion 3021 of the lower mold 302, respectively, so that the film layers 304 prevent a gap from being formed between the upper and lower molds 301 and 302 and the conductive portion 11 by deforming during compression, whereby the fluid material is prevented from entering the upper surface and the lower surface of the conductive portion 11 in a subsequent molding process. Therefore, both the upper and lower sides of the circuit board assembly 1 that is finally formed can be directly conducted through the conductive portion 11, thereby avoiding contamination of the conductive portion 11, particularly the upper surface of the conductive portion 11, to ensure product yield of the circuit board assembly 1.

The upper pressing portion 3012 of the upper mold 301 and the lower pressing portion 3022 of the lower mold 302 are directly pressed together after the molding die 300 performs a mold closing operation, and the molding space 303 is formed between the conductive portion 11 and the upper and lower molds 301 and 302.

Preferably, in the present example, the first conductive portion 111 and the second conductive portion 112 have the same height so that the final circuit board assembly 1 has a flat surface.

The molding space 303 includes at least one transverse guide groove and at least one longitudinal guide groove. The transverse guide groove and the longitudinal guide groove are perpendicular to each other and communicates with each other for the flow of the fluid material therethrough to fill the entire molding die 300. For the entire molding die 300, a single one of the transverse guide grooves or a single one of the longitudinal guide grooves can be completely penetrated, so that the entire process of injecting the fluid material can be completed by injection from one side of the molding die 300.

With continued reference to FIG. 8A, the fluid material is added to at least one of the molding spaces 303, and the fluid material fills all of the molding spaces 303 by a transfer molding process or a press molding process to form the insulating portion 12, so that the insulating portion 12 and the conductive portion 11 are integrally molded.

The fluid material may be a liquid, a solid, or a solid-liquid mixture, or the like, so that the fluid material may be flow. The fluid material may be a thermoset material. Of course, it will be appreciated by those skilled in the art that the material of the fluid material is not limited thereto.

With continued reference to FIG. 8A, the mold drawing operation may be performed by the molding mold 300, and the upper mold 301 may be drawn first, as shown in FIG. 8A.

With continued reference to FIG. 8B, the semi-finished product of the circuit board assembly is obtained after a mold drawing operation is performed by the molding die 300. The semi-finished product of the circuit board assembly may be cut to obtain a single circuit board assembly 1.

Further, in this example, in the lateral direction, the second conductive portions 112 of the adjacent conductive portion 11 are disposed adjacent to each other, and the first conductive portions 111 of the adjacent conductive portion 11 are disposed adjacent to each other. During the cutting process, a single circuit board assembly 1 may be obtained, or a plurality of circuit board assemblies 1 may be obtained to meet the needs of some arrayed electronic devices.

In other examples of the present disclosure, in the lateral direction, the first conductive portion 111 and the second conductive portion 112 of the adjacent conductive portions 11 are provided at intervals, that is, the first conductive portion 111 of one of the conductive portions 11 is adjacent to the second conductive portion 112 of the adjacent conductive portion 11.

It will be appreciated that the upper end of the bracket 20 is formed at a position corresponding to the lower molding guide groove 3023 of the lower mold 302. The shape of the lower molding guide groove 3023 determines the shape of the bracket 20.

The bracket 20 has a high end and a low end. The low end is connected to the circuit board assembly 1, and the high end can be used to support an optical auxiliary element 3. The high end of the bracket 20 may be of an inclined structure to facilitate stable support of the optical auxiliary element 3. The optical auxiliary element 3 has a side surface, and the side surface is arranged to be inclined inwardly from top to bottom.

According to another aspect of the present disclosure, there is provided a method of manufacturing a circuit board assembly 1. The manufacturing method includes the steps of:

(a) placing at least one conductive portion 11 into a molding die 300;
(b) performing a mold closing process by the molding mold 300 to form a molding space 303 between the conductive portion 11 and an upper mold 301 and a lower mold 302 of the molding die 300;
(c) adding a fluid material to the molding space 303 so that the fluid material fills the molding space 303 and solidifies within the molding space 303; and
(d) after a mold drawing process is performed by the molding die 300, at least one insulating portion 12 and at least one bracket 20 integrally bonded to the circuit board assembly 1 is formed on the circuit board assembly 1.

According to an embodiment of the present disclosure, the conductive portion 11 is formed by an etching process, and a side surface of the conductive portion 11 is provided inclined inwardly.

According to an embodiment of the invention, the step (d) further includes the steps of:

Performing a mold drawing process by the molding die 300 to form a semi-finished product of the circuit board assembly, which includes a plurality of conductive portions 11 and the insulating portions 12 and the bracket 20 integrally bonded to the conductive portions 11; and Cutting the semi-finished product of the circuit board assembly to obtain the circuit board assembly 1.

According to an embodiment of the present disclosure, the bracket 20 is integrally bonded to a side surface of the conductive portion 11.

According to an embodiment of the present disclosure, the bracket 20 is integrally bonded to a side surface of the insulating portion 12.

According to an embodiment of the present disclosure, in the above method, at least a part of the insulating portion 12 is located between the first conductive portion 111 and the second conductive portion 112 to separate the first conductive portion 111 and the second conductive portion 112.

According to an embodiment of the present disclosure, in the above method, at least a part of the insulating portion 12 is formed on at least a part of the side surface of the conductive portion 11.

According to an embodiment of the present disclosure, the step (d) is implemented as: after the mold drawing process is performed by the molding die 300, the insulating portion 12 integrally bonded to the conductive portion 11 and a bracket 20 integrally bonded to the insulating portion 12 are formed on the conductive portion 11.

According to an embodiment of the present disclosure, in the above method, the insulating portion 12 integrally bonded to a side surface of the conductive portion 11 is formed.

According to an embodiment of the present disclosure, in the step (d), the insulating portion 12 integrally bonded to a side surface and an upper surface of the conductive portion 11 is formed on the conductive portion 11. The upper surface of the conductive portion 11 is used to support the electronic component.

According to an embodiment of the present disclosure, in the step (d), the insulating portion 12 integrally bonded to a side surface and a lower surface of the conductive portion 11 is formed on the conductive portion 11.

According to an embodiment of the present disclosure, the method further includes a step of reducing the thickness of the insulating portion 12 to expose the lower surface of the conductive portion 11.

According to an embodiment of the present disclosure, the method further includes a step of reducing the thickness of the insulating portion 12 to expose the upper surface of the conductive portion 11.

According to an embodiment of the present disclosure, the method further includes a step of reducing the thickness of the insulating portion 12 to expose the side surface of the conductive portion 11.

According to an embodiment of the present disclosure, in the above method, the conductive portion 11 includes a first conductive portion 111 and a second conductive portion 112, and at least part of the insulating layer separates the first conductive portion 111 and the second conductive portion 112.

According to an embodiment of the present disclosure, in the above method, each of the conductive portions 11 is independent of each other.

According to an embodiment of the present disclosure, in the above method, a conductive portion 11 is connected to an adjacent conductive portion 11.

According to another aspect of the present disclosure, there is provided a method of manufacturing a semi-finished product of the circuit board assembly. The manufacturing method includes the steps of:
  (a) placing a plurality of conductive portions 11 into a molding die 300;
  (b) performing a mold closing process by the molding die 300 to form a molding space 303 between the conductive portion 11 and an upper mold 301 and a lower mold 302 of the molding die 300;
  (c) adding a fluid material having an insulating property to the molding space 303 so that the fluid material fills the molding space 303 and solidifies within the molding space 303; and
  (d) after a mold drawing process is performed by the molding die 300, an insulating portion 12 integrally bonded to the conductive portion 11 is formed on each of the conductive portions 11 to obtain a semi-finished product of the circuit board assembly.

It will be appreciated that the plurality of the conductive portions 11 may be a conductive tile. In such a way, the placement of the conductive portions 11 in one molding die 300 can be completed at one time, so as to save processes and improve work efficiency.

According to some embodiments of the present disclosure, in the above method, each of the conductive portions 11 is connected to an adjacent conductive portion 11.

According to some embodiments of the present disclosure, in the above method, the conductive portion 11 includes a first conductive portion III and a second conductive portion 112. The insulating portion 12 is integrally molded to the first conductive portion 111 and the second conductive portion 112, and the first conductive portion 111 and the second conductive portion 112 are separated by at least part of the insulating portion 12.

According to some embodiments of the present disclosure, the first conductive portion 111 of one of the conductive portions 11 is connected to the first conductive portion 111 of an adjacent one of the conductive portions 11.

According to some embodiments of the present disclosure, the second conductive portion 112 of one of the conductive portions 11 is connected to the second conductive portion 112 of an adjacent one of the conductive portions 11.

According to some embodiments of the present disclosure, the first conductive portion 111 of one of the conductive portions 11 is connected to the second conductive portion 112 of an adjacent one of the conductive portions 11.

According to some embodiments of the present disclosure, in the above process, the method further includes a step of:

Etching a copper plate to form a plurality of the conductive portions 11.

Figure 9:
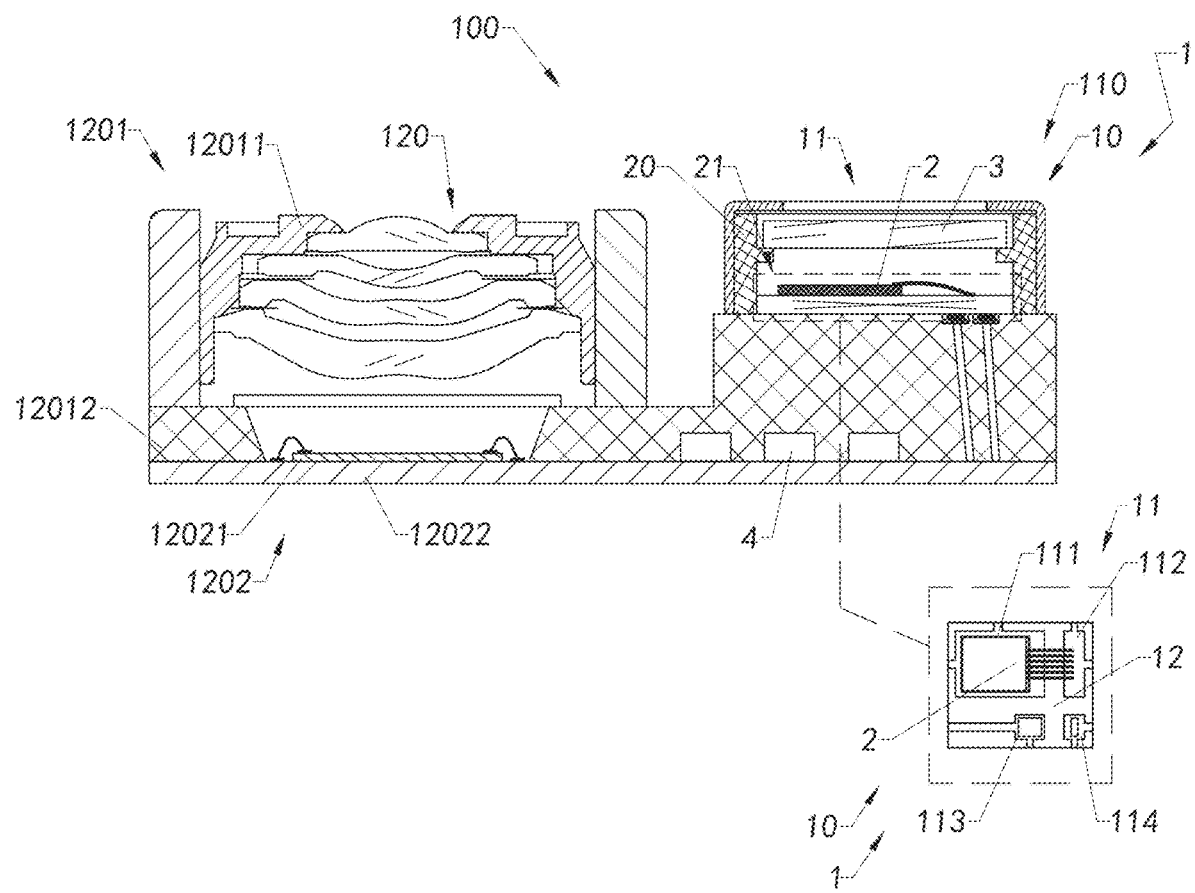
FIG. 9 is a schematic diagram of a TOF camera module with a circuit board assembly according to an embodiment of the present disclosure.

Referring to FIG. 9, another embodiment of the TOF camera module 100 according to the present disclosure is shown.

The TOF camera module 100 includes the floodlight 110 for generating a light ray to a subject to be photographed, the light ray being reflected by the subject, and the receiving unit 120 for receiving the reflected light ray and obtaining depth information of the subject to be photographed according to the information of the emitted light ray and the reflected light ray.

The receiving unit 120 includes the lens assembly 1201 for receiving light and the photosensitive circuit 1202 for receiving the light and converting the optical signal to an electrical signal based on a photoelectric conversion principle. The lens assembly 1201 further includes the optical lens 12011 and the base 12012, and the photosensitive circuit 1202 includes the photosensitive element 12021 and the circuit board 12022. The optical lens 12011 and the floodlight 110 are supported on the base 12012, respectively, and the photosensitive element 12021 is conductively connected to the circuit board 12022. In this example, the base 12012 is integrally molded to the circuit board 12022. The floodlight 110 is conductively connected to the base 12012.

The circuit board assembly 1 includes the conductive portion 11 and the insulating portion 12. The conductive portion 11 includes the first conductive portion 111 and the second conductive portion 112, and the first conductive portion 111 and the second conductive portion 112 are separated by the insulating portion 12 to avoid direct contact between the first conductive portion 111 and the second conductive portion 112.

The conductive portion 11 further includes a third conductive portion 113 surrounded by the insulating portion 12 to be separated from the other conductive portion 11, and a fourth conductive portion 114 surrounded by the insulating portion 12 to be separated from the other conductive portion 11. Further, the third conductive portion 113 extends in the insulating portion 12, for example, extends through the insulating portion 12. Other electronic components may be placed on the third conductive portion 113 to be conductive through the third conductive portion 113.

The electronic component may be placed on the first conductive portion 111. In this embodiment, the electronic component is implemented as a light-emitting element 2. The floodlight 110 includes the light-emitting element 2 and the circuit board assembly 1. The light-emitting element 2 is supported on the circuit board assembly 1 and communicably connected to the circuit board assembly 1. The circuit board assembly 1 provides a light-passing path, and the light-emitting element 2 can be excited to emit light outward through the light-passing path after being powered.

The light-emitting element 2 has a front surface and a back surface. The front surface of the light-emitting element 2 is communicated with the second conductive portion 112 of the conductive portion 11 through a wire, and the back surface of the light-emitting element 2 is directly supported by the conductive portion 11 and communicated with the conductive portion 11.

The floodlight 110 further includes at least one electronic device 4. The electronic device 4 is conductively connected to the circuit board assembly 1. In this example, at least part of the electronic device 4 is disposed on the circuit board 12022 of the receiving unit 120 and is covered by the base 12012. The electronic device 4 is conductively connected to the circuit board assembly 1. Specifically, the electronic device 4 is conductively connected to the circuit board assembly 1 of the floodlight 110 through the circuit board 12022 of the receiving unit 120.

In some examples of the present disclosure, the light-emitting element 2 may be implemented as a Vertical-Cavity Surface-Emitting Laser (VCSEL). After energization, the Vertical-Cavity Surface-Emitting Laser can be energized to emit laser light.

It should be noted that the Vertical-Cavity Surface-Emitting Laser needs to be maintained at a certain temperature range to be able to operate normally, that is, the heat dissipation performance of the circuit board assembly 1 is important to the operating state of the Vertical-Cavity Surface-Emitting Laser. Since the first conductive portion 111 of the circuit board assembly 1 provides a large heat dissipation area, the Vertical-Cavity Surface-Emitting Laser can operate normally when supported on the first conductive portion 111.

Further, a back surface of the Vertical-Cavity Surface-Emitting Laser is a negative electrode, and a front surface of the Vertical-Cavity Surface-Emitting Laser is a positive electrode. When the Vertical-Cavity Surface-Emitting Laser is respectively communicated with the first conductive portion 111 and the second conductive portion 112, the first conductive portion 111 is a negative electrode, and the second conductive portion 112 is a positive electrode.

According to another aspect of the present disclosure, a heat dissipation method of a circuit board assembly 1 includes the steps of:

Directing heat generated by the electronic component to be transferred from the back surface of the electronic component to the upper surface of the first conductive portion 111;

Conducting heat to the lower surface of the first conductive portion 111; and Dissipating heat outwards.

According to some embodiments of the present disclosure, the electronic element is a light-emitting element 2.

According to some embodiments of the present disclosure, the front surface of the electronic component is conductively connected to the second conductive portion 112.

According to another aspect of the present disclosure, there is provided an electronic device 1000 which includes an electronic device body 200 and a main circuit board. The main circuit board is disposed on the electronic device body 200 and conductively connected to the electronic device body 200.

The electronic device 1000 further includes a floodlight 110 with a flexible circuit board, and the floodlight 110 can be conductively mounted on the main circuit board of the electronic device.

In other examples of the present disclosure, the electronic device 1000 further includes a floodlight 110, and the floodlight 110 is conductively mounted on the main circuit board of the electronic device 1000. Specifically, the circuit board assembly of the floodlight 110 can be conductively connected to the main circuit board of the electronic device 1000.

It will be appreciated that the floodlight 110 and the receiving unit 120 may be simultaneously mounted in an electronic device body 200. The floodlight 110 and the receiving unit 120 may be integrally formed by an assembly.

Figure 10A:
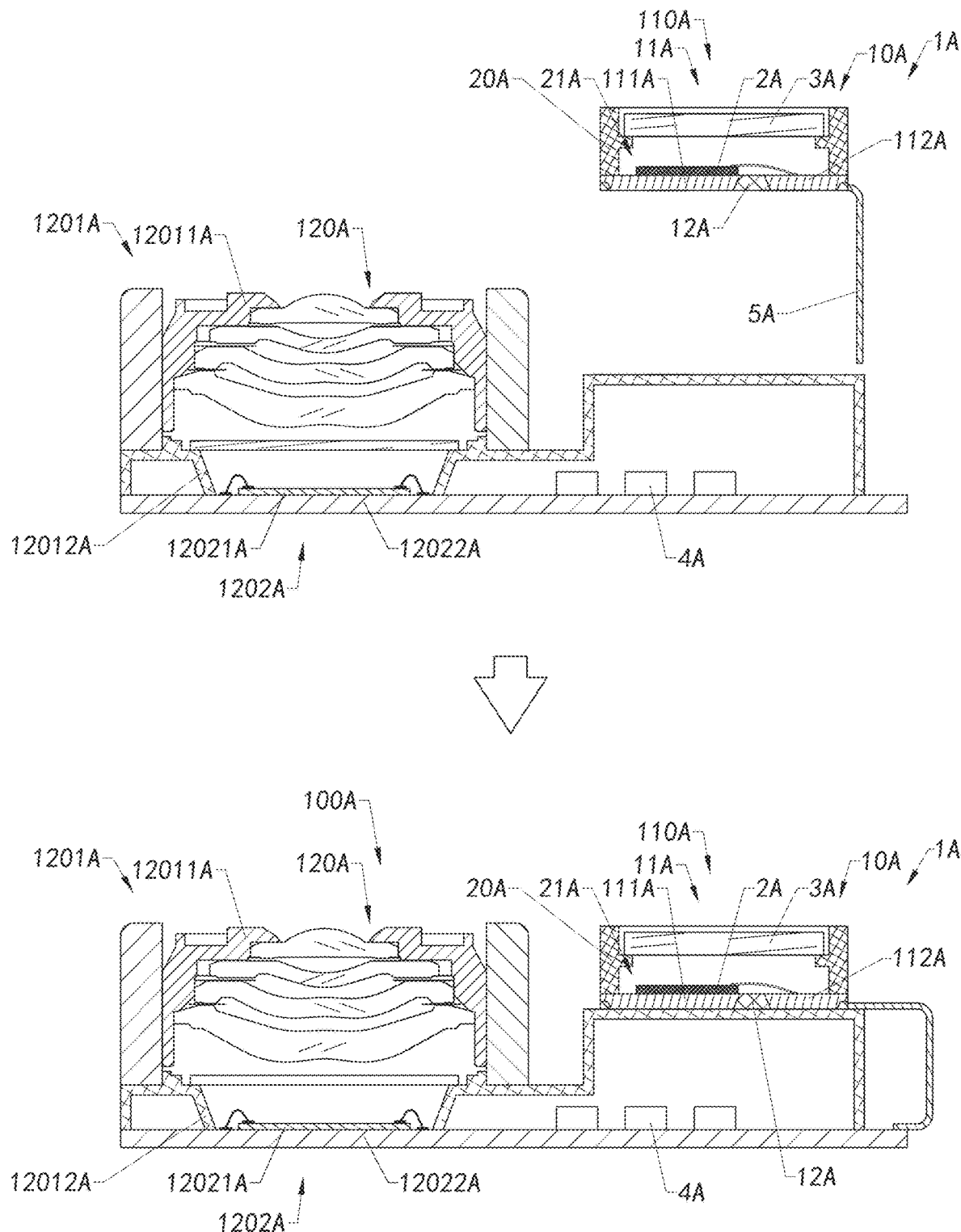
FIG. 10A is a schematic diagram of an application of a floodlight according to an embodiment of the present disclosure.

FIG. 10A illustrates an embodiment of a floodlight 110A according to the present disclosure. Specifically, according to another aspect of the present disclosure, there is provided a floodlight 110A having a flexible circuit board 5A. The floodlight 110A can be mounted to a receiving unit 120A to form a TOF camera module 100A.

The floodlight 110A includes a flexible circuit board 5A, at least one electronic device 4A, a bracket 20A, a light-emitting element 2A, and a circuit board assembly 1A manufactured according to the above manufacturing method. The bracket 20A forms a light window 21A. The light-emitting element 2A is conductively supported on the circuit board assembly 1A by the circuit board assembly 1A. The flexible circuit board 5A is conductively connected to the circuit board assembly 1A. The electronic device 4A is conductively connected to the circuit board assembly 1A and the light-emitting element 2A. The floodlight 110A may further include an optical auxiliary element 3A, and the optical auxiliary element 3A is supported on the bracket 20A. The light emitted from the light-emitting element 2A is emitted outwardly by the optical auxiliary element 3A. The flexible circuit board 5A may be conductively connected to the circuit board assembly 1A by means of conductive adhesive, or may be conductively connected to the circuit board assembly 1A by means of a card slot.

The circuit board assembly 1A includes a circuit board 10A and the bracket 20A. The bracket 20A is connected to the circuit board 10A. The circuit board 10A includes a conductive portion 11A and an insulating portion 12A. The insulating portion 12A is integrally molded to the conductive portion 11A. The conductive portion 11A includes a first conductive portion 111A and a second conductive portion 112A, and the first conductive portion 111A and the second conductive portion 112A are separated by the insulating portion 12A. The light-emitting element 2A is conductively supported on the first conductive portion 111A.

The receiving unit 120A includes a lens assembly 1201A and a photosensitive circuit 1202A. The photosensitive circuit 1202A includes a photosensitive element 12021A and a first circuit board 12022A. The lens assembly 1201A provides a light path for light to reach the photosensitive element 12021A for photoelectric conversion. The photosensitive element 12021A is conductively connected to the first circuit board 12022A. In this example, at least part of the electronic components 4A of the floodlight 110A are disposed on the first circuit board 12022A of the receiving unit 120A to facilitate reduction in size of the floodlight 110A.

The floodlight 110A with the flexible circuit board 5A can be mounted to the receiving unit 120A through the flexible circuit board 5A. The first circuit board 12022A of the receiving unit 120A is conductively connected to the flexible circuit board 5A.

Figure 10B:
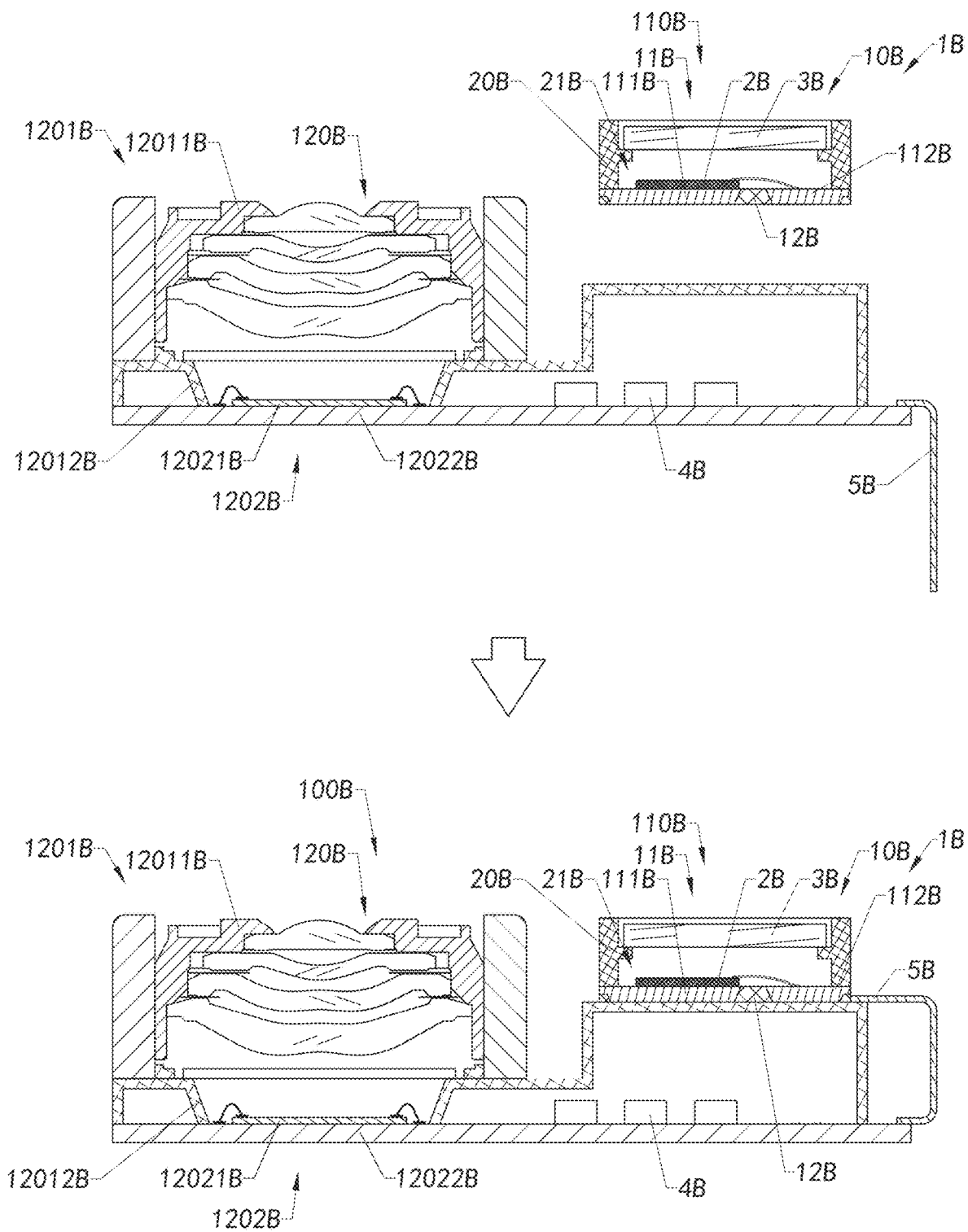
FIG. 10B is a schematic diagram of an application of a floodlight according to an embodiment of the present disclosure.

Referring to FIG. 10B, according to another aspect of the present disclosure, there is provided a floodlight 110B which can be mounted to a receiving unit 120B having a flexible circuit board to form a TOF camera module 100B.

The floodlight 110B includes a flexible circuit board 5B, at least one electronic component 4B, a bracket 20B, a light-emitting element 2B, and a circuit board assembly 1B manufactured according to the above manufacturing method. The bracket 20B forms a light window 21B. The light-emitting element 2B is conductively connected to the circuit board assembly 1B and supported on the circuit board assembly 18. The electronic device 4B is conductively connected to the circuit board assembly 1B and the light-emitting element 2B. The floodlight 110B may further include an optical auxiliary element 3B, and the optical auxiliary element 3B is supported on the bracket 20B. The light emitted from the light-emitting element 2B is emitted outwardly by the optical auxiliary element 3B.

The circuit, board assembly 1B includes a circuit board 10B and the bracket 20B. The bracket 20B is connected to the circuit board 10B. The circuit board 10B includes a conductive portion 11B and an insulating portion 12B. The insulating portion 12B is integrally molded to the conductive portion 11B. The conductive portion 11B includes a first conductive portion 111B and a second conductive portion 112B, and the first conductive portion 111B and the second conductive portion 112B are separated by the insulating portion 12B. The light-emitting element 2B is conductively supported on the first conductive portion 111B.

The receiving unit 120B includes a lens assembly 1201B and a photosensitive assembly 1202B. The photosensitive assembly 1202B further includes a photosensitive element 12021B and a first circuit board 12022B. The lens assembly 1201B provides a light path for light to reach the photosensitive element 12021B for photoelectric conversion. The photosensitive element 12021B is conductively connected to the first circuit board 12022B. The flexible circuit board 5B is conductively connected to the first circuit board 12022B. It will be appreciated that the flexible circuit board 5B may be connected to the first circuit board 12022B of the receiving unit 120B by a conductive adhesive, and the flexible circuit board 5B may also be connected to the first circuit board 12022B of the receiving unit 120B by a card slot. In this example, at least part of the electronic components 4B of the floodlight 110B are disposed on the first circuit board 12022B of the receiving unit 120B to facilitate reduction of the size of the floodlight 110B.

The floodlight 110B is assembled to the receiving unit by being conductively connected to the flexible circuit board 5B of the receiving unit 120B, thereby forming the TOF camera module 100B.

It will be appreciated by those skilled in the art that the above description and the embodiments of the disclosure shown in the accompanying drawings are by way of example only and do not limit the disclosure. The objects of the present disclosure have been fully and efficiently achieved. The functional and structural principles of the present disclosure have been shown and described in embodiments, and without departing from the principles, embodiments of the present disclosure may be varied or modified in any manner.

What is claimed is:

1. A semi-finished product of a circuit board assembly, comprising:
   a plurality of conductive portions and a plurality of insulating portions,
   wherein each of the conductive portions comprises a first conductive portion and a second conductive portion,
   wherein the insulating portions are integrally molded to the first conductive portions and the second conductive portions, and for each conductive portion, the first conductive portion and the second conductive portion are separated by at least part of an insulating portion, and
   wherein adjacent conductive portions are connected to each other, and
   the first conductive portion of one of the conductive portions is connected to the first conductive portion of an adjacent one of the conductive portions by a connector before the semi-finished product is divided into a plurality of circuit board assemblies each comprising a conductive portion of the plurality of conductive portions and an insulating portion of the plurality of insulating portions.

2. The semi-finished product of the circuit board assembly according to claim 1, wherein the second conductive portion of one of the conductive portions is connected to the second conductive portion of an adjacent one of the conductive portions.

3. A semi-finished product of a circuit board assembly, comprising:
   a plurality of conductive portions and a plurality of insulating portions,
   wherein each of the conductive portions comprises a first conductive portion and a second conductive portion,
   wherein the insulating portions are integrally molded to the first conductive portions and the second conductive portions, and for each conductive portion, the first conductive portion and the second conductive portion are separated by at least part of an insulating portion, and
   wherein adjacent conductive portions are connected to each other, and
   wherein the first conductive portion of one of the conductive portions is connected to the second conductive portion of an adjacent conductive portion by a connector before the semi-finished product is divided into a plurality of circuit board assemblies each comprising a conductive portion of the plurality of conductive portions and an insulating portion of the plurality of insulating portions.

4. The semi-finished product of the circuit board assembly according to claim 1,
   wherein the first conductive portion has an upper surface, and the second conductive portion has an upper surface, and
   wherein the upper surface of the first conductive portion is larger than the upper surface of the second conductive portion.

5. The semi-finished product of the circuit board assembly according to claim 1,
   wherein the first conductive portion has an upper surface and a lower surface that are oppositely disposed, and
   wherein the upper surface of the first conductive portion is larger than the lower surface of the first conductive portion.

6. A time of flight (TOF) camera module, comprising:
   a floodlight, used to emit a light ray to a subject to be photographed, the floodlight comprising a light-emitting element, a circuit board assembly formed by dividing the semi-finished product of the circuit board assembly according to claim 1,
   a bracket forming a light window, wherein the light-emitting element is supported by the first conductive portion of the circuit board assembly, and the bracket is connected to the circuit board assembly; and
   a receiver, configured to receive a reflected light ray reflected by the subject to be photographed, and obtain a depth information of the subject to be photographed based on information of the emitted light ray and the reflected light ray.

7. The TOF camera module according to claim 6, wherein the receiver comprises a lens assembly, a photosensitive element, a circuit board, and a flexible circuit board,
   wherein the lens assembly provides a light-passing path for light to reach the photosensitive element for photoelectric conversion, and
   wherein the photosensitive element is conductively connected to the circuit board, the circuit board is conductively connected to the flexible circuit board, and the floodlight is conductively connected to the flexible circuit board.

8. The TOF camera module according to claim 6, wherein the floodlight further comprises a flexible circuit board which is conductively connected to the conductive portion of the circuit board assembly.

* * * * *